US010409411B2

(12) United States Patent
Heo et al.

(10) Patent No.: US 10,409,411 B2
(45) Date of Patent: *Sep. 10, 2019

(54) DISPLAY DEVICE WITH INTEGRATED TOUCH SCREEN

(71) Applicant: LG Display Co., Ltd., Seoul (KR)

(72) Inventors: JoonYoung Heo, Paju-si (KR); Yeonsuk Kang, Paju-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

This patent is subject to a terminal disclaimer.

(21) Appl. No.: 16/363,968

(22) Filed: Mar. 25, 2019

(65) Prior Publication Data

US 2019/0220126 A1 Jul. 18, 2019

Related U.S. Application Data

(63) Continuation of application No. 15/644,507, filed on Jul. 7, 2017.

(30) Foreign Application Priority Data

Dec. 26, 2016 (KR) .......................... 10-2016-0178813

(51) Int. Cl.
*G06F 3/041* (2006.01)
*H01L 27/32* (2006.01)
*H01L 51/52* (2006.01)

(52) U.S. Cl.
CPC .......... *G06F 3/0412* (2013.01); *G06F 3/0416* (2013.01); *H01L 27/322* (2013.01);
(Continued)

(58) Field of Classification Search
CPC ................. G06F 3/0412; G06F 3/0416; G06F 2203/4103; G06F 2203/0411;
(Continued)

(56) References Cited

U.S. PATENT DOCUMENTS

2005/0231669 A1* 10/2005 Kim ...................... G02F 1/1339
349/138
2006/0048473 A1 3/2006 Kim et al.
(Continued)

FOREIGN PATENT DOCUMENTS

JP   H 06-337432 A    12/1994
JP   2006-058894 A     3/2006
(Continued)

OTHER PUBLICATIONS

Japanese Patent Office, Office Action, JP Patent Application No. 2017-220764, dated Sep. 13, 2018, seven pages (with concise explanation of relevance).
(Continued)

*Primary Examiner* — Ariel A Balaoing
(74) *Attorney, Agent, or Firm* — Fenwick & West LLP

(57) ABSTRACT

Disclosed are a display device with integrated touch screen, in which a touch sensing layer is provided on an encapsulation layer without forming a separate insulation layer, and thus, an increase in thickness caused by the touch sensing layer is minimized. The display device with integrated touch screen includes a plurality of first touch electrodes and a plurality of second touch electrodes disposed on a substrate, a black matrix disposed on the plurality of first touch electrodes and the plurality of second touch electrodes, and a plurality of bridge electrodes on the black matrix, the plurality of bridge electrodes disposed to electrically connect the plurality of first touch electrodes. The plurality of bridge electrodes are connected to the plurality of first touch electrodes through a plurality of contact holes passing through the black matrix, respectively.

17 Claims, 22 Drawing Sheets

(52) U.S. Cl.
CPC ........ *H01L 27/323* (2013.01); *H01L 27/3246* (2013.01); *H01L 51/5253* (2013.01); *H01L 51/5284* (2013.01); *G06F 2203/04103* (2013.01); *G06F 2203/04111* (2013.01)

(58) Field of Classification Search
CPC . H01L 27/322; H01L 27/323; H01L 27/3246; H01L 51/5253; H01L 51/5284
See application file for complete search history.

(56) References Cited

U.S. PATENT DOCUMENTS

| | | | |
|---|---|---|---|
| 2008/0018613 A1* | 1/2008 | Kim | G06F 3/0412 345/173 |
| 2008/0129898 A1 | 6/2008 | Moon | |
| 2009/0322989 A1* | 12/2009 | Kim | G02F 1/133308 349/65 |
| 2013/0271689 A1 | 10/2013 | Kim et al. | |
| 2013/0341651 A1* | 12/2013 | Kim | H01L 31/0232 257/84 |
| 2014/0043284 A1* | 2/2014 | Park | G06F 3/044 345/174 |
| 2014/0070350 A1 | 3/2014 | Kim et al. | |
| 2014/0183478 A1* | 7/2014 | Lee | H01L 51/56 257/40 |
| 2014/0284572 A1* | 9/2014 | Oooka | H01L 51/525 257/40 |
| 2014/0293199 A1 | 10/2014 | Sakae et al. | |
| 2014/0313435 A1* | 10/2014 | Cho | H01J 9/20 349/12 |
| 2015/0364507 A1* | 12/2015 | Won | G06F 3/0412 257/43 |
| 2016/0154499 A1 | 6/2016 | Bae et al. | |
| 2016/0162060 A1 | 6/2016 | Hong et al. | |
| 2016/0260780 A1* | 9/2016 | Kim | H01L 27/323 |
| 2016/0282989 A1 | 9/2016 | Hirakata et al. | |
| 2016/0363797 A1 | 12/2016 | Kimura et al. | |

FOREIGN PATENT DOCUMENTS

| | | |
|---|---|---|
| JP | 2008-122913 A | 5/2008 |
| JP | 2008-170885 A | 7/2008 |
| JP | 2012-256612 A | 12/2012 |
| JP | 2013-222202 A | 10/2013 |
| JP | 2014-056564 A | 3/2014 |
| JP | 2014-085771 A | 5/2014 |
| JP | 2014-186844 A | 10/2014 |
| JP | 2014-191348 A | 10/2014 |
| JP | 3197252 U | 4/2015 |
| JP | 2015-168611 A | 9/2015 |
| JP | 2016-128884 A | 7/2016 |
| JP | 2016-167083 A | 9/2016 |
| JP | 2016-181261 A | 10/2016 |
| KR | 20120042438 A | 5/2012 |
| KR | 20140143498 A | 12/2014 |

OTHER PUBLICATIONS

Japan Patent Office, Notification of Reasons for Refusal, JP Patent Application No. 2017-220764, dated Apr. 2, 2019, 12 pages.
United States Office Action, U.S. Appl. No. 15/644,507, dated Jun. 22, 2018, 16 pages.

* cited by examiner

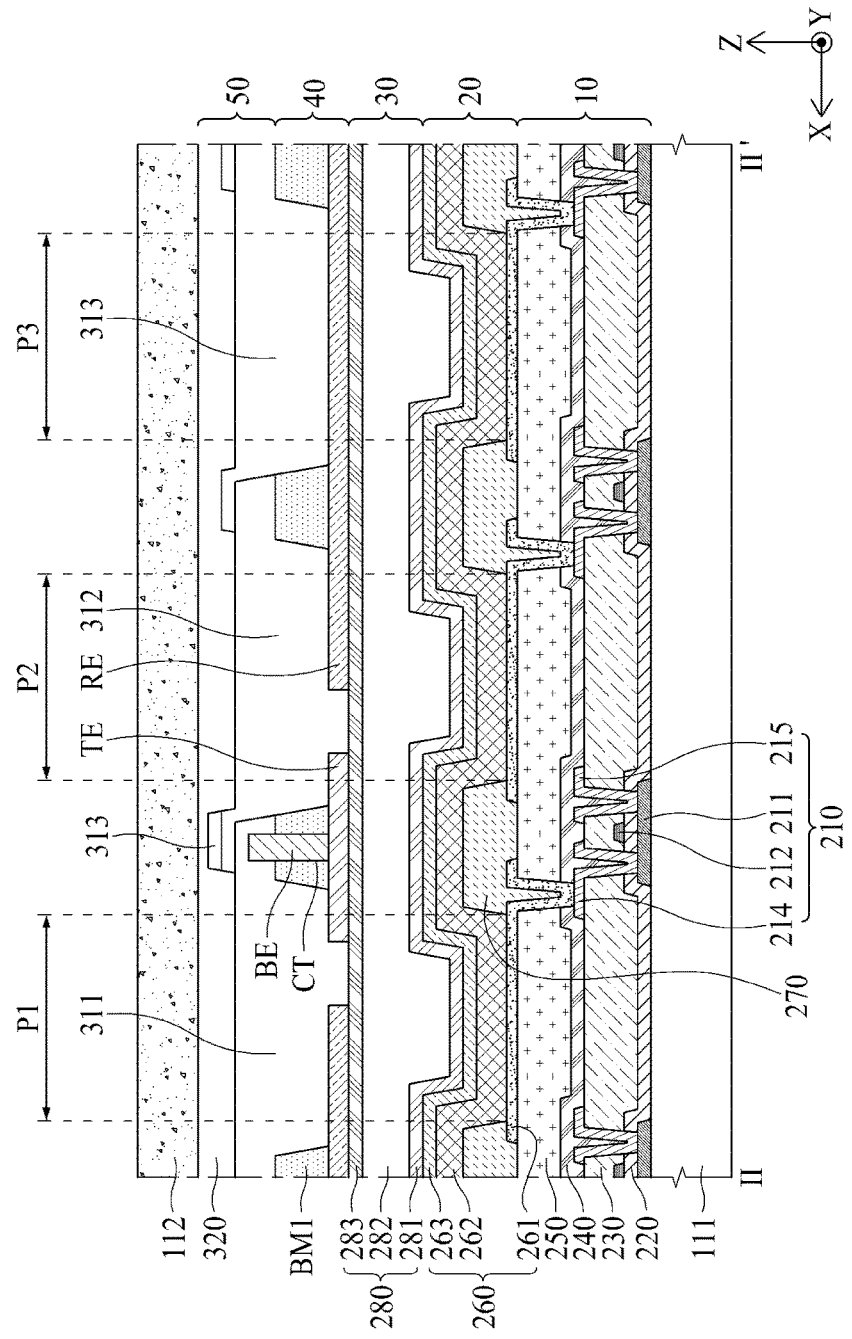

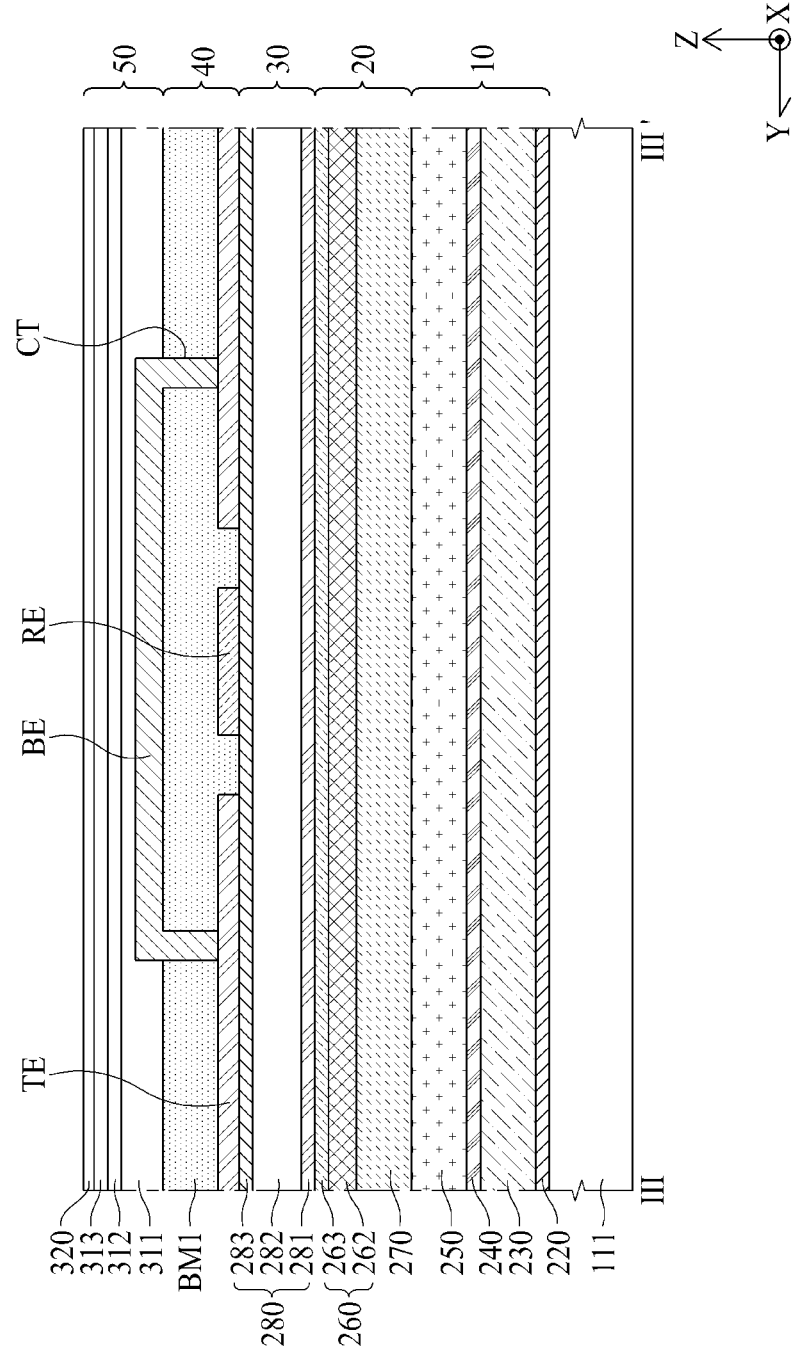

DISPLAY DEVICE WITH INTEGRATED TOUCH SCREEN

CROSS-REFERENCE TO RELATED APPLICATIONS

This application is a continuation application of U.S. patent application Ser. No. 15/644,507 filed on Jul. 7, 2017, which claims the benefit of Republic of Korea Patent Application No. 10-2016-0178813 filed on Dec. 26, 2016, all of which are hereby incorporated by reference as if fully set forth herein.

BACKGROUND

Field of the Disclosure

The present disclosure relates to a display device with integrated touch screen and a method of manufacturing the same.

Discussion of the Related Art

With the advancement of information-oriented society, various requirements for display devices for displaying an image are increasing. Therefore, various display devices such as liquid crystal display (LCD) devices, plasma display panels (PDPs), and organic light emitting display devices are being used recently. In such display devices, the organic light emitting display devices are driven with a low voltage and have characteristics such as thinness, an excellent viewing angle, a fast response speed, etc.

The organic light emitting display devices each include a display panel which includes a plurality of data lines, a plurality of scan lines, and a plurality of pixels respectively provided in a plurality of pixel areas defined by intersections of the data lines and the scan lines, a scan driver which respectively supplies scan signals to the scan lines, and a data driver which respectively supplies data voltages to the data lines. Each of the pixels includes an organic light emitting device, a driving transistor which controls the amount of current supplied to the organic light emitting device according to a voltage of a gate electrode, and a scan transistor which supplies a data voltage of a corresponding data line to the gate electrode of the driving transistor in response to a scan signal of a corresponding scan line.

Recently, the organic light emitting display devices are implemented as a display device with integrated touch screen including a touch screen panel capable of sensing a touch of a user. In this case, the organic light emitting display devices function as a touch screen device. Recently, a touch screen device is applied to monitors such as navigations, industrial terminals, notebook computers, financial automation equipment, and game machines, portable terminals such as portable phones, MP3 players, PDAs, PMPs, PSPs, portable game machines, DMB receivers, and tablet personal computers (PCs), and home appliances such as refrigerators, microwave ovens, and washing machines. Since all users can easily manipulate the touch screen device, the application of the touch screen device is being progressively expanded.

In the display device with integrated touch screen, Tx electrodes and Rx electrodes are provided in a display panel. For example, in the display device with integrated touch screen, the Tx electrodes, the Rx electrodes, and bridge electrodes for connecting the Tx electrodes or the Rx electrodes are provided on an encapsulation layer for encapsulating an organic light emitting device. Also, the display device with integrated touch screen includes a polarizer for preventing image quality from being degraded by light incident from the outside.

In this case, however, the display device with integrated touch screen has a problem where a thickness increases. Also, because external light is reflected by the polarizer, a screen looks like a mirror in the outdoors, and for this reason, the display device with integrated touch screen has another problem where image visibility is reduced in the outdoors.

SUMMARY

Accordingly, the present disclosure is directed to provide a display device with integrated touch screen and a method of manufacturing the same that substantially obviates one or more problems due to limitations and disadvantages of the related art.

An aspect of the present disclosure is directed to provide a display device with integrated touch screen and a method of manufacturing the same, in which an increase in thickness caused by touch electrodes is minimized.

Another aspect of the present disclosure is directed to provide a display device with integrated touch screen and a method of manufacturing the same, in which a contrast ratio is enhanced.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a display device with integrated touch screen including a plurality of first touch electrodes and a plurality of second touch electrodes disposed on a substrate, a black matrix disposed on the plurality of first touch electrodes and the plurality of second touch electrodes, and a plurality of bridge electrodes on the black matrix, the plurality of bridge electrodes disposed to overlap each other and electrically connecting the plurality of first touch electrodes. The plurality of bridge electrodes are connected to the plurality of first touch electrodes through a plurality of contact holes passing through the black matrix, respectively.

In another aspect of the present disclosure, there is provided a display device with integrated touch screen, the display device comprising a first substrate, a second substrate, and an organic light emitting device layer, an encapsulation layer, a touch sensing layer and a color filter layer disposed between the first substrate and the second substrate, wherein the touch sensing layer includes a plurality of first touch electrodes and a plurality of second touch electrodes on the first substrate, a black matrix on the plurality of first touch electrodes and the plurality of second touch electrodes, and a plurality of bridge electrodes on the black matrix, the plurality of bridge electrodes overlapping each other and electrically connecting the plurality of first touch electrodes, wherein the black matrix and the bridge electrodes are disposed between the color filter layer and the encapsulation layer.

In another aspect of the present disclosure, there is provided a method of manufacturing a display device with integrated touch screen, the method including forming a plurality of first touch electrodes and a plurality of second touch electrodes on a substrate, forming a black matrix on the plurality of first touch electrodes and the plurality of second touch electrodes, and forming a bridge electrode on the black matrix, the bridge electrode electrically connecting adjacent first touch electrodes.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure.

FIGS. 12A to 12F are cross-sectional views for describing a method of manufacturing a display device with integrated touch screen according to an embodiment of the present disclosure.

FIGS. 13A to 13F are cross-sectional views taken along line III-III' of FIG. 5 for describing a method of manufacturing a display device with integrated touch screen according to an embodiment of the present disclosure.

DETAILED DESCRIPTION OF THE DISCLOSURE

Figure 1:
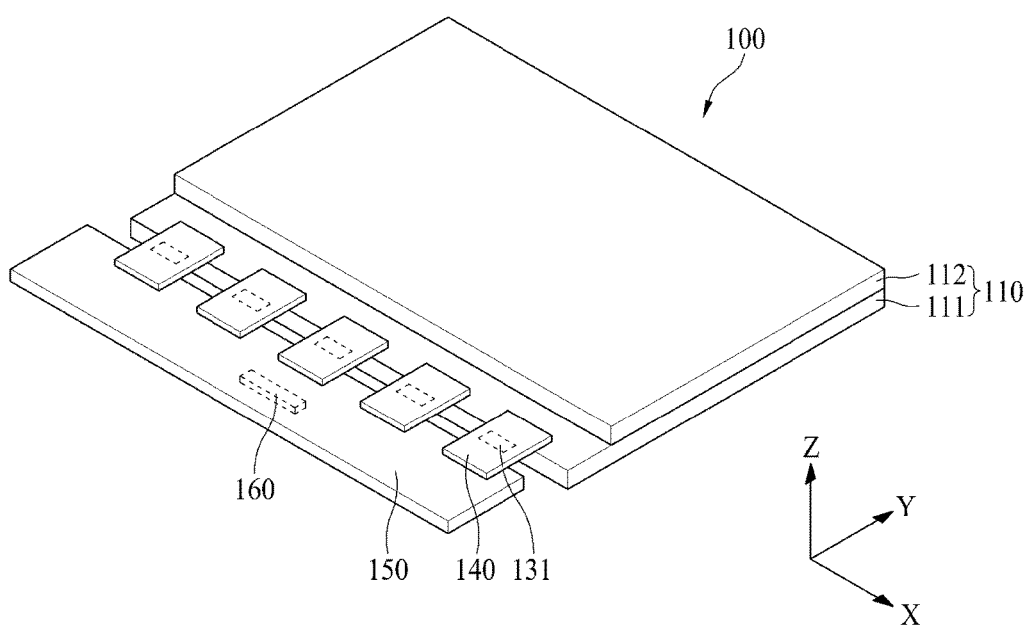
FIG. 1 is a perspective view illustrating a display device with integrated touch screen according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

An X axis direction, a Y axis direction, and a Z axis direction should not be construed as only a geometric relationship where a relationship therebetween is strictly vertical, and may denote having a broader directionality within a scope where elements of the present disclosure operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, exemplary embodiments of the present disclosure will be described in detail with reference to the accompanying drawings.

Figure 2:
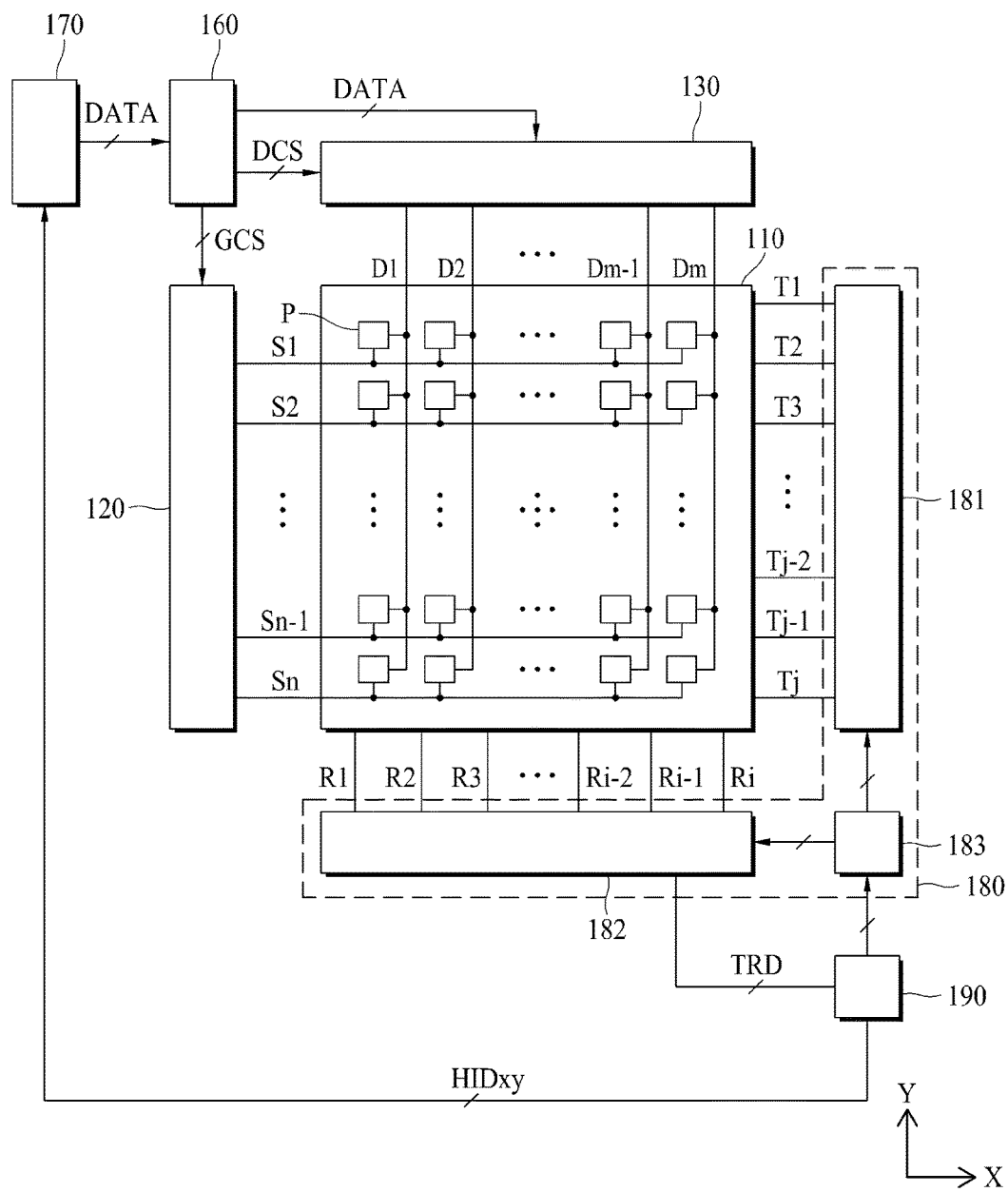
FIG. 2 is a block diagram illustrating a display device with integrated touch screen according to an embodiment of the present disclosure.

FIG. 1 is a perspective view illustrating a display device with integrated touch screen according to an embodiment of the present disclosure. FIG. 2 is a block diagram illustrating the display device with integrated touch screen according to an embodiment of the present disclosure.

Referring to FIGS. 1 and 2, the display device with integrated touch screen according to an embodiment of the present disclosure may include a display panel 110, a scan driver 120, a data driver 130, a timing controller 160, a host system 170, a touch driver 180, and a touch coordinate calculator 190.

The display device with integrated touch screen according to an embodiment of the present disclosure may be implemented as a flat panel display device such as an LCD device, a field emission display (FED) device, a PDP, an organic light emitting display device, an electrophoresis (EPD) device, or the like. In this disclosure below, an example where the display device with integrated touch screen according to an embodiment of the present disclosure is implemented as an organic light emitting display device will be described, but the present embodiment is not limited thereto.

The display panel 110 may include a first substrate 111 and a second substrate 112. The second substrate 112 may be an encapsulation substrate. The first substrate 111 may be a plastic film, a glass substrate, or the like. The second substrate 112 may be a plastic film, a glass substrate, an encapsulation film (a protective film), or the like.

The display panel 110 may include a display area where a plurality of pixels P are provided to display an image. A plurality of data lines D1 to Dm (where m is a positive integer equal to or more than two) and a plurality of scan lines S1 to Sn (where n is a positive integer equal to or more than two) may be arranged in the display panel 110. The data lines D1 to Dm and the scan lines S1 to Sn may be arranged to intersect each other. The pixels P may be respectively provided in a plurality of pixel areas defined by intersections of the data lines and the scan lines.

Each of the pixels P of the display panel 110 may be connected to one of the data lines D1 to Dm and one of the scan lines S1 to Sn. Each of the pixels P of the display panel 110 may include a driving transistor which controls a drain-source current according to a data voltage applied to a gate electrode of the driving transistor, a scan transistor which is turned on by a scan signal of a corresponding scan line and supplies a data voltage of a corresponding data line to the gate electrode of the driving transistor, an organic light emitting diode (OLED) which emits light according to the drain-source current of the driving transistor, and a capacitor which stores a voltage of the gate electrode of the driving transistor. Therefore, each of the pixels P may emit light according to a current supplied to the OLED.

The scan driver 120 may receive a scan control signal GCS from the timing controller 160. The scan driver 120 may respectively supply scan signals to the scan lines S1 to Sn according to the scan control signal GCS.

The scan driver 120 may be provided in a non-display area outside one side or each of both sides of the display area of the display panel 110 in a gate driver in panel (GIP) type. Alternatively, the scan driver 120 may be manufactured as a driving chip, mounted on a flexible film, and attached on the non-display area outside the one side or each of the both sides of the display area of the display panel 110 in a tape automated bonding (TAB) type.

The data driver 130 may receive digital video data DATA and a data control signal DCS from the timing controller 160. The data driver 130 may convert the digital video data DATA into analog positive/negative data voltages according to the data control signal DCS and may respectively supply the data voltages to the data lines. That is, pixels to which the data voltages are to be supplied may be selected by the scan signals of the scan driver 120, and the data voltages may be supplied to the selected pixels.

The data driver 130, as illustrated in FIG. 1, may include a plurality of source drive ICs 131. Each of the plurality of source drive ICs 131 may be mounted on a flexible film 140 in a chip-on film (COF) type or a chip-on plastic (COP) type. The flexible film 140 may be attached on pads provided in the non-display area of the display panel 110 by using an anisotropic conducting film, and thus, the source drive ICs 131 may be connected to the pads.

The flexible film 140 may be provided in a plurality, and a circuit board 150 may be attached on the plurality of flexible films 140. A plurality of circuits which are implemented as a plurality of driving chips may be mounted on the circuit board 150. For example, the timing controller 160 may be mounted on the circuit board 150. The circuit board 150 may be a printed circuit board (PCB) or a flexible printed circuit board (FPCB).

The timing controller 160 may receive the digital video data DATA and timing signals from the host system 170. The timing signals may include a vertical synchronization signal, a horizontal synchronization signal, a data enable signal, a dot clock, etc. The vertical synchronization signal may be a signal that defines one frame period. The horizontal synchronization signal may be a signal that defines one horizontal period necessary for supplying data voltages to pixels of one horizontal line of the display panel 110. The data enable signal may be a signal that defines a period where valid data is input. The dot clock may be a signal that is repeated at a certain short period.

The timing controller 160 may generate the data control signal DCS for controlling an operation timing of the data driver 130 and the scan control signal GCS for controlling an operation timing of the scan driver 120 based on the timing signals, for the operation timing of each of the scan driver 120 and the data driver 130. The timing controller 160 may output the scan control signal GCS to the scan driver 120 and may output the digital video data DATA and the data control signal DCS to the data driver 130.

The host system 170 may be implemented as a navigation system, a set-top box, a DVD player, a blue-ray player, a personal computer (PC), a home theater system, a broadcasting receiver, a phone system, or the like. The host system 170 may include a system-on chip (SoC) with a built-in scaler and may convert the digital video data DATA of an input image into a format suitable for displaying the image on the display panel 110. The host system 170 may transmit the digital video data DATA and the timing signals to the timing controller 160.

In addition to the data lines DL1 to DLm and the scan lines SL1 to SLn, a plurality of first and second touch electrodes may be provided in the display panel 110. The first touch electrodes may be provided to intersect the second touch electrodes. The first touch electrodes may be connected to a first touch driver 181 through a plurality of first touch lines T1 to Tj (where j is a positive integer equal to or more than two). The second touch electrodes may be connected to a second touch driver 182 through a plurality of second touch lines R1 to Ri (where i is a positive integer equal to or more than two). A plurality of touch sensors may be respectively provided in intersection portions of the first touch electrodes and the second electrodes. In an embodiment of the present disclosure, each of the touch sensors is exemplarily implemented with a mutual capacitor, but is not limited thereto. The first and second touch electrodes will be described later in detail with reference to FIG. 4.

The touch driver 180 may supply a driving pulse to the first touch electrodes through the first touch line T1 to Tj and may sense charging variation amounts of the touch sensors through the second touch lines R1 to Ri. That is, in FIG. 2, it is described that the first touch line T1 to Tj are Tx lines through which the driving pulse is supplied, and the second touch lines R1 to Ri are Rx lines through which the charging variation amounts of the touch sensors are respectively sensed.

The touch driver 180 may include a first touch driver 181, a second touch driver 182, and a touch controller 183. The first touch driver 181, the second touch driver 182, and the touch controller 183 may be integrated into one readout integrated chip (ROIC).

The first touch driver 181 may select a first touch line, through which the driving pulse is to be output, according to control by the touch controller 183 and may supply the driving pulse to the selected first touch line. For example, the driving pulse may be provided in a plurality, and the first touch driver 181 may sequentially supply the driving pulses to the first touch lines T1 to Tj.

The second touch driver 182 may select second touch lines, from which charging variation amounts of touch sensors are to be received, according to control by the touch controller 183 and may receive the charging variation amounts of the touch sensors through the selected second touch lines. The second touch driver 182 may sample the charging variation amounts of the touch sensors received through the second touch lines R1 to Ri to convert the charging variation amounts into touch raw data TRD which are digital data.

The touch controller 183 may generate a Tx setup signal for setting a first touch line, to which the driving pulse is to be output from the first touch driver 181, and an Rx setup signal for setting a second touch line from which a touch sensor voltage is to be received from the second touch driver 182. Also, the touch controller 183 may generate timing control signals for controlling the operation timings of the first touch driver 181 and the second touch driver 182.

The touch coordinate calculator 190 may receive the touch raw data TRD from the touch driver 180. The touch coordinate calculator 190 may calculate touch coordinates, based on a touch coordinate calculation method and may output touch coordinate data HIDxy, including information about the touch coordinates, to the host system 170.

The touch coordinate calculator 190 may be implemented with a micro controller unit (MCU). The host system 170 may analyze the touch coordinate data HIDxy input from the touch coordinate calculator 190 to execute an application program associated with coordinates where a touch has been performed by a user. The host system 170 may transmit the digital video data DATA and the timing signals to the timing controller 160 according to the executed application program.

The touch driver 180 may be included in the source drive ICs 131, or may be manufactured as a separate driving chip and mounted on the circuit board 150. Also, the touch coordinate calculator 190 may be manufactured as a separate driving chip and mounted on the circuit board 150.

Figure 3:
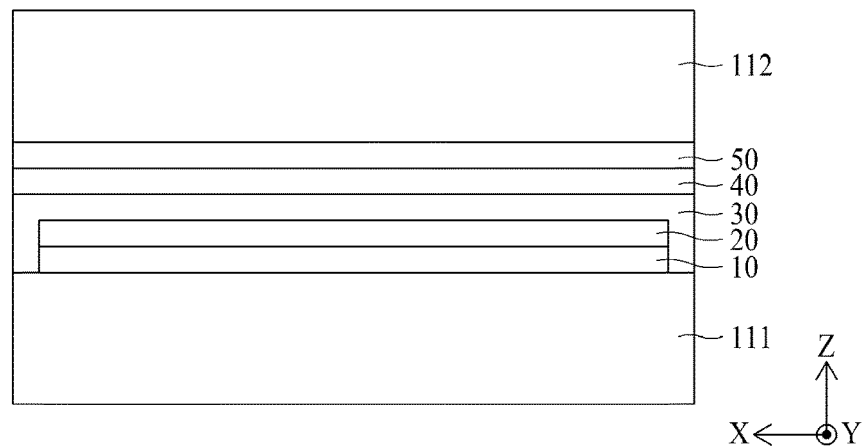
FIG. 3 is a cross-sectional view schematically illustrating one side of a display panel of FIG. 1 according to an embodiment of the present disclosure.

FIG. 3 is a cross-sectional view schematically illustrating one side of the display panel 110 of FIG. 1 according to an embodiment of the present disclosure.

Referring to FIG. 3, the display panel 110 may include a first substrate 111, a second substrate 112, and a thin film transistor (TFT) layer 10, an organic light emitting device layer 20, an encapsulation layer 30, a touch sensing layer 40, and a color filter layer 50 disposed between the first substrate 111 and the second substrate 112.

The first substrate 111 may be a plastic film, a glass substrate, or the like.

The TFT layer 10 may be formed on the first substrate 111. The TFT layer 10 may include the scan lines, the data lines, and a plurality of TFTs. The TFTs may each include a gate electrode, a semiconductor layer, a source electrode, and a drain electrode. In case where the scan driver is provided in the GIP type, the scan driver may be provided along with the TFT layers 10.

The organic light emitting device layer 20 may be formed on the TFT layer 10. The organic light emitting device layer 20 may include a first electrode, an organic light emitting layer, a second electrode, and a bank. The organic light emitting layer may include a hole transporting layer, a light emitting layer, and an electron transporting layer. In this case, when a voltage is applied to the first electrode and the second electrode, a hole and an electron move to the light emitting layer through the hole transporting layer and the electron transporting layer and are combined with each other in the light emitting layer to emit light. Since the pixels are provided in an area where the organic light emitting device layer 20 is formed, the area where the organic light emitting device layer 20 is formed may be defined as a display area. A peripheral area of the display area may be defined as a non-display area.

The encapsulation layer 30 may be formed on the organic light emitting device layer 20. The encapsulation layer 30 prevents oxygen or water from penetrating into the organic light emitting layer 20. The encapsulation layer 30 may include at least one inorganic layer.

The touch sensing layer 40 may be formed on the encapsulation layer 30. The touch sensing layer 40 may include first and second touch electrodes for sensing a user touch and may include a black matrix and a plurality of bridge electrodes formed on the first and second touch electrodes. In this case, in an embodiment of the present disclosure, a through hole (contact hole) may be formed in the black matrix, and the bridge electrodes may be connected to the first touch electrode through the through hole, thereby minimizing an increase in thickness of the display device with integrated touch screen caused by the touch sensing layer 40. A plane structure of the touch sensing layer 40 will be described below with reference to FIGS. 4 and 5. Also, a cross-sectional structure of the touch sensing layer 40 will be described below in detail with reference to FIGS. 6 to 10.

The color filter layer 50 may be formed on the touch sensing layer 40. In a case where the organic light emitting device layer 20 includes a plurality of organic light emitting layers emitting red light, green light, and blue light, the color filter layer 50 may be omitted.

The second substrate 112 may be provided on the color filter layer 50. The second substrate 112 may act as a cover substrate or a cover window which covers the first substrate 111. The second substrate 112 may be a plastic film, a glass substrate, an encapsulation film (a protective film), or the like.

Figure 4:
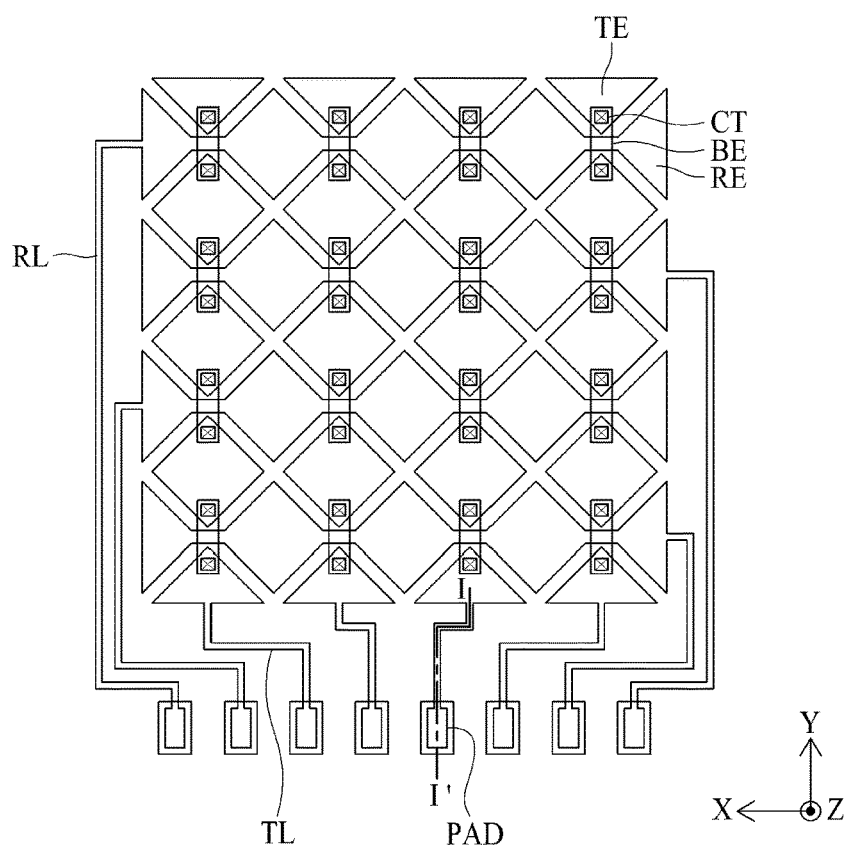
FIG. 4 is a plan view illustrating a touch sensing layer of the display device with integrated touch screen of FIG. 1 according to an embodiment of the present disclosure.
Figure 5:
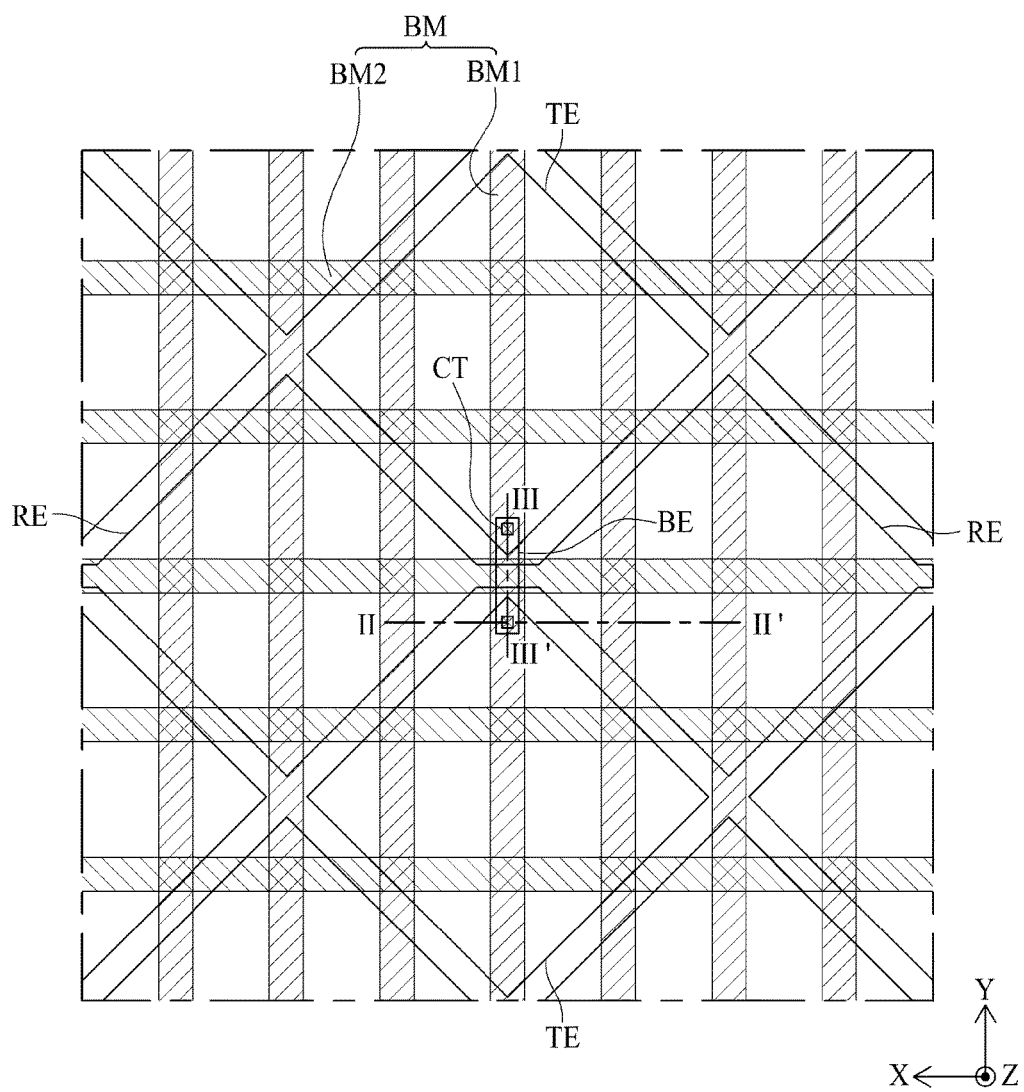
FIG. 5 is an enlarged view of the touch sensing layer of FIG. 4 according to an embodiment of the present disclosure.
Figure 6:
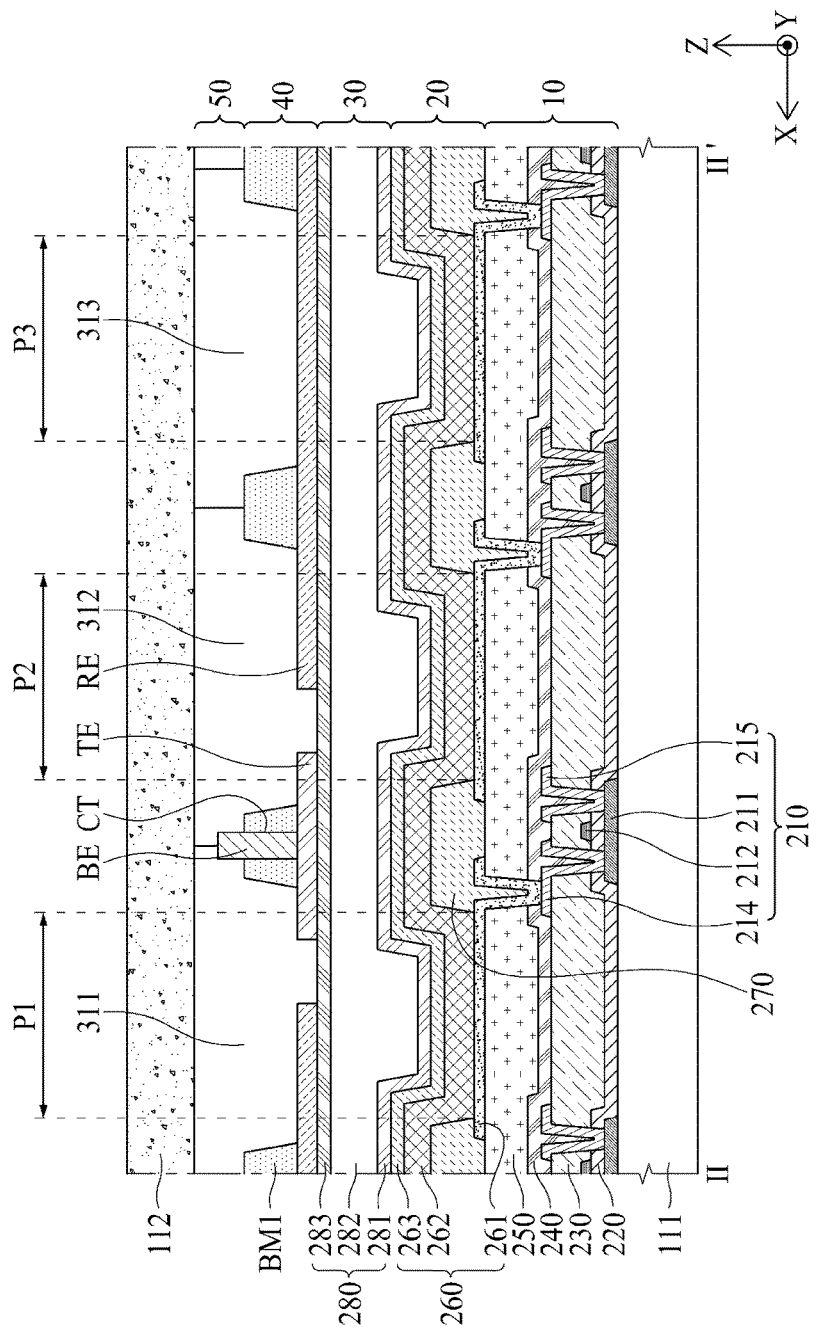
FIG. 6 is a cross-sectional view illustrating an example taken along line II-II' of FIG. 5 according to an embodiment of the present disclosure.
Figure 7:
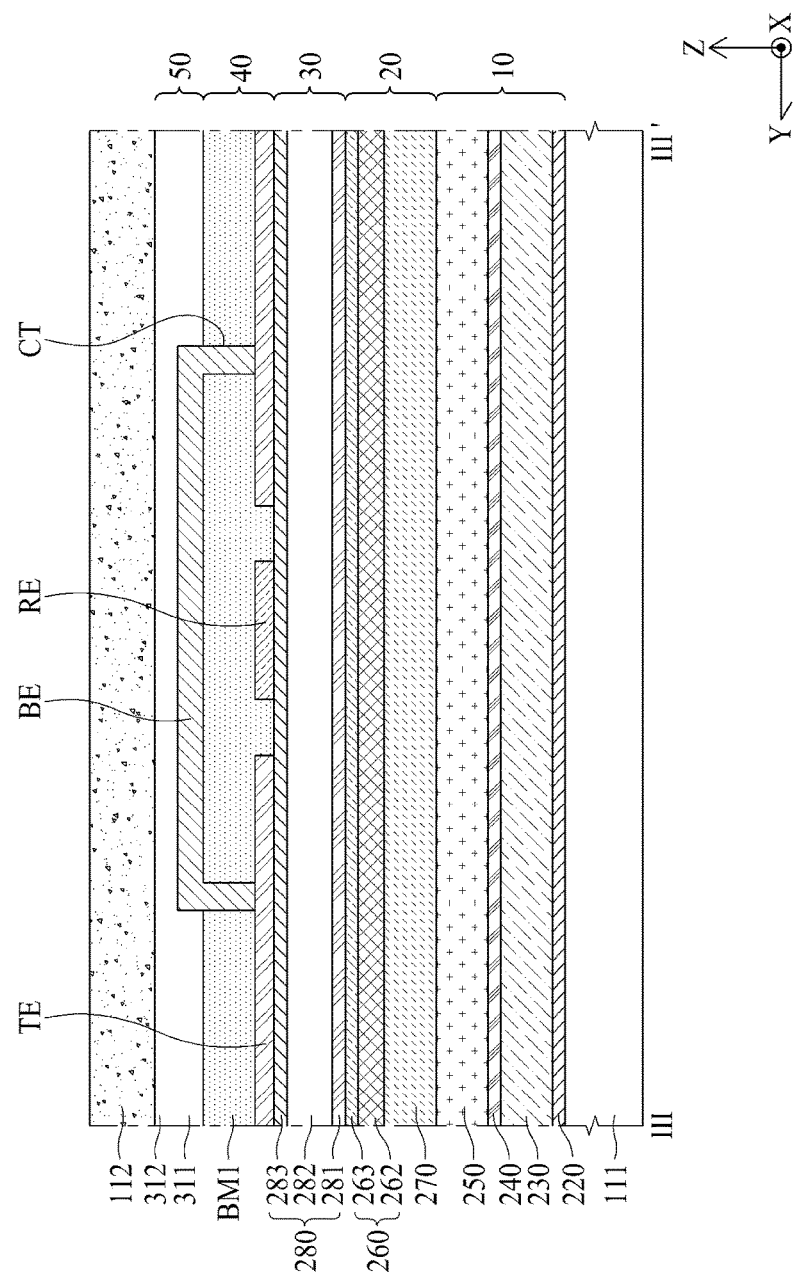
FIG. 7 is a cross-sectional view illustrating an example taken along line III-III' of FIG. 5 according to an embodiment of the present disclosure.
Figure 8:
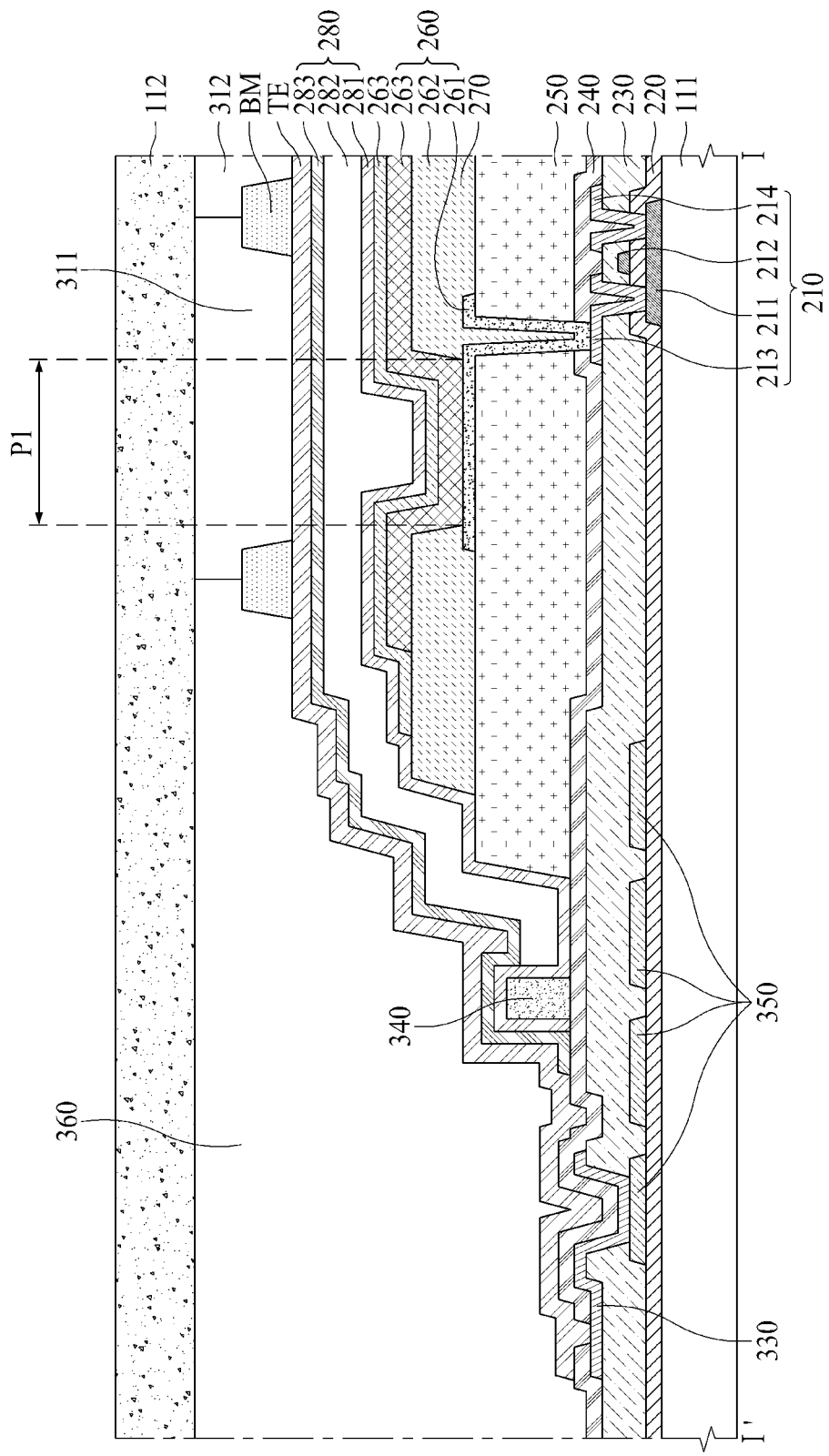
FIG. 8 is a cross-sectional view illustrating an example taken along line I-I' of FIG. 4 according to an embodiment of the present disclosure.

FIG. 4 is a plan view illustrating a touch sensing layer of the display device with integrated touch screen of FIG. 1 according to an embodiment of the present disclosure. FIG. 5 is an enlarged view of the touch sensing layer of FIG. 4 according to an embodiment of the present disclosure. FIG. 6 is a cross-sectional view illustrating an example taken along line II-II' of FIG. 5 according to an embodiment of the present disclosure. FIG. 7 is a cross-sectional view illustrating an example taken along line III-III' of FIG. 5 according to an embodiment of the present disclosure. FIG. 8 is a cross-sectional view illustrating an example taken along line I-I' of FIG. 4 according to an embodiment of the present disclosure.

Referring to FIGS. 4 to 8, a TFT layer 10 may be formed on a first substrate 111. The TFT layer 10 may include a plurality of TFTs 210, a gate insulation layer 220, an interlayer insulation layer 230, a passivation layer 240, and a planarization layer 250.

A buffer layer may be formed on one surface of the first substrate 111. The buffer layer may be formed on the one surface of the first substrate 111, for protecting the TFTs 210 and a plurality of organic light emitting devices 260 from water penetrating through the first substrate 111 vulnerable to penetration of water. The one surface of the first substrate 111 may be a surface facing the second substrate 112. The buffer layer may be formed of a plurality of inorganic layers which are alternately stacked. For example, the buffer layer may be formed of a multilayer where one or more inorganic layers of silicon oxide (SiOx), silicon nitride (SiNx), and SiON are alternately stacked. The buffer layer may be omitted.

The TFTs 210 may be formed on the buffer layer. The TFTs 210 may each include an active layer 211, a gate electrode 212, a source electrode 214, and a drain electrode 215. In FIG. 6, the TFTs 210 are exemplarily illustrated as being formed in a top gate type where the gate electrode 212 is disposed on the active layer 211, but is not limited thereto. That is, the TFTs 210 may be formed in a bottom gate type where the gate electrode 212 is disposed under the active layer 211 or a double gate type where the gate electrode 212 is disposed both on and under the active layer 211.

The active layer 211 may be formed on the buffer layer. The active layer 211 may be formed of a silicon-based semiconductor material, an oxide-based semiconductor material, and/or the like. A light blocking layer (not shown) for blocking external light incident on the active layer 211 may be formed between the buffer layer and the active layer 211.

The gate insulation layer 220 may be formed on the active layer 211. The gate insulation layer 220 may be formed of an inorganic layer, and for example, may be formed of silicon oxide (SiOx), silicon nitride (SiNx), or a multilayer thereof.

The gate electrode 212 and a gate line may be formed on the gate insulation layer 220. The gate electrode 212 and the gate line may each be formed of a single layer or a multilayer which includes one of molybdenum (Mo), aluminum (Al), chromium (Cr), gold (Au), titanium (Ti), nickel (Ni), neodymium (Nd), and copper (Cu), or an alloy thereof.

The interlayer insulation layer 230 may be formed on the gate electrode 212 and the gate line. The interlayer insulation layer 230 may be formed of an inorganic layer, and for example, may be formed of SiOx, SiNx, or a multilayer thereof.

The source electrode 214, the drain electrode 215, and a data line may be formed on the interlayer insulation layer 230. Each of the source electrode 214 and the drain electrode 215 may contact the active layer 211 through a contact hole which passes through the gate insulation layer 220 and the interlayer insulation layer 230. The source electrode 214, the drain electrode 215, and the data line may each be formed of a single layer or a multilayer which includes one of Mo, Al, Cr, Au, Ti, Ni, Nd, and Cu, or an alloy thereof.

The passivation layer 240 for insulating the TFT 210 may be formed on the source electrode 214, the drain electrode 215, and the data line. The passivation layer 240 may be formed of an inorganic layer, and for example, may be formed of SiOx, SiNx, or a multilayer thereof.

The planarization layer 250 for planarizing a step height caused by the TFT 210 may be formed on the passivation layer 240. The planarization layer 250 may be formed of an organic layer such as acryl resin, epoxy resin, phenolic resin, polyamide resin, polyimide resin, and/or the like.

The organic light emitting device layer 20 may be formed on the TFT layer 10. The organic light emitting device layer 20 may include the organic light emitting devices 260 and a bank 270.

The organic light emitting devices 260 and the bank 270 may be formed on the planarization layer 250. The organic light emitting devices 260 may each include a first electrode 261, an organic light emitting layer 262, and a second electrode 263. The first electrode 261 may be an anode electrode, and the second electrode 263 may be a cathode electrode.

The first electrode 261 may be formed on the planarization layer 250. The first electrode 261 may be connected to the source electrode 214 of the TFT 210 through a contact hole which passes through the passivation layer 240 and the planarization layer 250. The first electrode 261 may be formed of a metal material, which is high in reflectivity, such as a stacked structure (Ti/Al/Ti) of Al and Ti, a stacked structure (ITO/Al/ITO) of Al and ITO, an APC alloy, or a stacked structure (ITO/APC/ITO) of an APC alloy and ITO. The APC alloy may be an alloy of Ag, palladium (Pd), and Cu.

The bank 270 may be formed on the planarization layer 250 to cover an edge of the first electrode 261, for dividing a plurality of pixels P1 to P3. That is, the bank 270 may act as a pixel defining layer that defines the pixels P1 to P3.

Each of the pixels P1 to P3 may denote an area where a first electrode 261 corresponding to an anode electrode, an organic light emitting layer 262, and a second electrode 263 corresponding to a cathode electrode are sequentially stacked, and a hole from the first electrode 261 and an electron from the second electrode 263 are combined with each other in the organic light emitting layer 262 to emit light. In this case, a first pixel P1 may be defined as a red subpixel, a second pixel P2 may be defined as a green subpixel, and a third pixel P3 may be defined as a blue subpixel. Also, the first to third pixels P1 to P3 may be defined as one unit pixel. However, an embodiment of the present disclosure is not limited thereto, and a white subpixel may be additionally defined.

The organic light emitting layer 262 may be formed on the first electrode 261 and the bank 270. The organic light emitting layer 262 may be a common layer which is formed in the pixels P1 to P3 in common, and may be a white light emitting layer which emits white light. In this case, the organic light emitting layer 262 may be formed in a tandem structure including two or more stacks. Each of the stacks may include a hole transporting layer, at least one light emitting layer, and an electron transporting layer.

Moreover, a charge generating layer may be formed between the stacks. The charge generating layer may include an n-type charge generating layer, disposed adjacent to a lower stack, and a p-type charge generating layer which is formed on the n-type charge generating layer and is disposed adjacent to an upper stack. The n-type charge generating layer may inject an electron into the lower stack, and the p-type charge generating layer may inject a hole into the upper stack. The n-type charge generating layer may be formed of an organic layer where alkali metal, such as lithium (Li), sodium (Na), potassium (K), or cesium (Cs), or alkali earth metal such as magnesium (Mg), strontium (Sr), barium (Ba), or radium (Ra) is doped on an organic host material having an ability to transport electrons. The p-type charge generating layer may be an organic layer where a dopant is doped on an organic material having an ability to transport holes.

The second electrode 263 may be formed on the organic light emitting layer 262. The second electrode 263 may be formed to cover the organic light emitting layer 262. The second electrode 263 may be a common layer which is formed in a plurality of pixels such as red sub pixel, green subpixel, blue subpixel and white subpixel in common.

The second electrode 263 may be formed of a transparent conductive material (or TCO), such as indium tin oxide (ITO) or indium zinc oxide (IZO) capable of transmitting light, or a semi-transmissive conductive material such as Mg, Ag, or an alloy of Mg and Ag. If the second electrode 263 is formed of a semi-transmissive conductive material, emission efficiency is enhanced by a micro-cavity. A capping layer may be formed on the second electrode 263.

The encapsulation layer 30 may be formed on the organic light emitting device layer 20. The encapsulation layer 30 may include an encapsulation film 280.

An encapsulation film 280 may be formed on the second electrode 263. The encapsulation film 280 prevents oxygen or water from penetrating into the organic light emitting layer 262 and the second electrode 263. To this end, the encapsulation film 280 may include at least one inorganic film and at least one organic film. For example, the encapsulation film 280 may include a first inorganic film 281, an organic film 282, and a second inorganic film 283.

The first inorganic film 281 may be disposed on the second electrode 263. The first inorganic film 281 may be formed to cover the second electrode 263. The organic film 282 may be disposed on the first inorganic film 281. The organic film 282 may be formed to a sufficient thickness, for preventing particles from penetrating into the organic light emitting layer 262 and the second electrode 263 via the first inorganic film 281. The organic film 282, as illustrated in FIG. 8, may be blocked by a dam 340 so as not to cover a pad 330. The second inorganic film 283 may be disposed on the organic film 282. The second inorganic film 283 may be formed to cover the organic film 282.

Each of the first and second inorganic films 281 and 283 may be formed of silicon nitride, aluminum nitride, zirconium nitride, titanium nitride, hafnium nitride, tantalum nitride, silicon oxide, aluminum oxide, titanium oxide, and/or the like. The organic film 282 may be formed of acryl resin, epoxy resin, phenolic resin, polyamide resin, polyimide resin, and/or the like.

The touch sensing layer 40 may be formed on the encapsulation layer 30. The touch sensing layer 40 may include a plurality of first touch electrodes TE, a plurality of second touch electrodes RE, a plurality of bridge electrodes BE, and a black matrix BM.

The first touch electrodes TE and the second touch electrodes RE may be formed on the encapsulation layer 30. The first touch electrodes TE may be arranged in a first direction (a Y-axis direction) and connected to each other, and the second touch electrodes RE may be arranged in a second direction (an X-axis direction) and connected to each other. The first direction (the Y-axis direction) may be a direction parallel to the scan lines S1 to Sn, and the second direction (the X-axis direction) may be a direction parallel to the data lines D1 to Dm. Alternatively, the first direction (the Y-axis direction) may be a direction parallel to the data lines D1 to Dm, and the second direction (the X-axis direction) may be a direction parallel to the scan lines S1 to Sn.

Each of first touch electrodes TE connected to each other in the first direction (the Y-axis direction) may be electrically insulated from first touch electrodes TE which are adjacent to each other in the second direction (the X-axis direction). Each of second touch electrodes RE connected to each other in the second direction (the X-axis direction) may be electrically insulated from second touch electrodes RE which are adjacent to each other in the first direction (the Y-axis direction).

Therefore, a mutual capacitor corresponding to a touch sensor may be provided in an intersection area of the first touch electrode TE and the second touch electrode RE.

A first touch electrode TE, disposed in one side end among the first touch electrodes TE connected to each other in the first direction (the Y-axis direction), may be connected to the first touch line TL. The first touch line TL may be connected to the first touch driver 181 through the pad 330. The pad 330 is connected to a link line 350 connected to the first touch driver 181. Therefore, the first touch electrodes TE connected to each other in the first direction (the Y-axis direction) may receive the driving pulse from the first touch driver 181 through the first touch line TL. In one embodiment, the first touch line TL is connected to the pad 330 through a contact hole in the passivation layer 240 exposing at least a portion of the pad 330.

A second touch electrode RE, disposed in one side end among the second touch electrodes RE connected to each other in the second direction (the X-axis direction), may be connected to the second touch line RL. The second touch line RL may be connected to the second touch driver 182 through the pad 330. The pad 330 is connected to a link line 350 connected to the second touch driver 182. Therefore, the second touch driver 182 may receive charging variation amounts of touch sensors from the second touch electrodes RE connected to each other in the second direction (the X-axis direction). In one embodiment, the second touch line RL is connected to the pad 330 through a contact hole in the passivation layer 240 exposing at least a portion of the pad 330.

The black matrix BM may be formed on the first touch electrodes TE and the second touch electrode RE. The black matrix BM may include a plurality of first black matrixes BM1 arranged in the first direction (the Y-axis direction) and a plurality of second black matrixes BM2 arranged in the second direction (the X-axis direction). The black matrix BM may have a lattice type where the first black matrixes BM1 and the second black matrixes BM2 intersect each other, and may divide first to third color filters 311 to 313 to respectively correspond to the first to third pixels P1 to P3. The black matrix BM may be provided in a non-emission part instead of an emission part and may be disposed to overlap the bank 270. The black matrix BM may be formed of an organic layer including a black pigment.

The bridge electrodes BE may be formed on the black matrix BM. In order to prevent the first touch electrodes TE and the second touch electrodes RE from being short-circuited in intersection areas therebetween, the first touch electrodes TE which are adjacent to each other in the first direction (the Y-axis direction) may be electrically connected to each other through the bridge electrodes BE. The bridge electrodes BE may be disposed on a layer different from a layer on which the first and second touch electrodes TE and RE are disposed, and may be connected to, through contact holes CT, the first touch electrodes TE adjacent to each other. The bridge electrodes BE may intersect the second touch electrodes RE.

In this case, the contact holes CT may be formed to pass through the black matrix BM, particularly, the first black matrix BM1 disposed in the first direction where the first touch electrodes TE are arranged. The bridge electrode BE may electrically connect two adjacent first touch electrodes TE through two contact holes CT which are formed in the first black matrix BM1 and expose the two adjacent first touch electrodes TE. Therefore, the bridge electrode BE may be disposed on the first black matrix BM1 to overlap the first black matrix BM1.

The first touch electrodes TE, the second touch electrodes RE, the first touch lines TL, and the second touch lines RL may be disposed on the same layer. The black matrix BM may be disposed on the first touch electrodes TE and the second touch electrodes RE, and moreover, may be disposed between the first touch electrodes TE and the second touch electrodes RE. Each of the first touch electrodes TE may be insulated from each of the second touch electrodes RE by the black matrix BM.

The color filter layer 50 may be formed on the touch sensing layer 40. The color filter layer 50 may include the first to third color filters 311 to 313 including different color materials from each other. The first to third color filters 311 to 313 having different transmissive wavelength ranges may be disposed in areas, divided by the black matrix BM, on the touch sensing layer 40. The first color filter 311 may be a red color filter disposed in correspondence with the first pixel P1, the second color filter 312 may be a green color filter disposed in correspondence with the second pixel P2, and the third color filter 313 may be a blue color filter disposed in correspondence with the third pixel P3.

The first color filter 311 may be formed of an organic layer including a red pigment, the second color filter 312 may be formed of an organic layer including a green pigment, and the third color filter 313 may be formed of an organic layer including a blue pigment.

Although not shown, the color filter layer 50 may further include a transparent organic layer disposed in correspondence with the white subpixel. In this case, the transparent organic layer may be formed of acryl resin, epoxy resin, phenolic resin, polyamide resin, polyimide resin, and/or the like.

At least one of the first to third color filters 311 to 313 may be formed on the black matrix BM. In an embodiment of the present disclosure, since the first to third color filters 311 to 313 are formed on the black matrix BM, two adjacent color filters may be formed to overlap each other on the black matrix BM. To provide description for example, in the color filter layer 50, the first color filter 311, the second color filter 312, and the third color filter 313 may be sequentially formed on the touch sensing layer 40. In this case, the first color filter 311 and the second color filter 312 may be sequentially formed to overlap each other on the black matrix BM disposed between the first color filter 311 and the second color filter 312. The second color filter 312 and the third color filter 313 may be sequentially formed to overlap each other on the black matrix BM disposed between the second color filter 312 and the third color filter 313. The third color filter 313 and the first color filter 311 may be sequentially formed to overlap each other on the black matrix BM disposed between the third color filter 313 and the first color filter 311.

Since the bridge electrodes BE are formed on the first black matrix BM1, at least one of the first to third color filters 311 to 313 may be formed on the bridge electrodes BE. In an embodiment of the present disclosure, as illustrated in FIG. 7, two adjacent color filters may be formed to overlap each other on the bridge electrodes BE. To provide description for example, in the color filter layer 50, the first color filter 311, the second color filter 312, and the third color filter 313 may be sequentially formed on the touch sensing layer 40. In this case, the first color filter 311 and the second color filter 312 may be sequentially formed to overlap each other on the bridge electrodes BE disposed between the first color filter 311 and the second color filter 312. The second color filter 312 and the third color filter 313 may be sequentially formed to overlap each other on the bridge electrodes BE disposed between the second color filter 312 and the third color filter 313. The third color filter 313 and the first color filter 311 may be sequentially formed to overlap each other on the bridge electrodes BE disposed between the third color filter 313 and the first color filter 311.

In an embodiment of the present disclosure, the bridge electrodes BE may be formed on the black matrix BM. In this case, the bridge electrodes BE may be formed of a metal material, causing a problem where the bridge electrodes BE reflect light incident from the outside. However, in an embodiment of the present disclosure, at least two of the first to third color filters 311 to 313 may be formed to overlap each other on the bridge electrodes BE, thereby decreasing reflection of external light by the bridge electrodes BE.

Moreover, the first to third color filters 311 to 313 may fill a space between the first touch electrodes TE and the second touch electrodes RE in an area where the black matrix BM is not formed. Accordingly, the first to third color filters 311 to 313 may be disposed between the first touch electrodes TE and the second touch electrodes RE to insulate each of the first touch electrodes TE from each of the second touch electrodes RE.

In an embodiment of the present disclosure, since the touch sensing layer 40 may be directly formed on the encapsulation layer 30 and the color filter layer 50 may be directly formed on the touch sensing layer 40, alignment is not needed in bonding the first substrate 111 to the second substrate 112, and a separate adhesive layer is not needed.

Moreover, according to an embodiment of the present disclosure, the black matrix BM may be directly formed on the first touch electrodes TE, and the bridge electrodes BE which electrically connect adjacent first touch electrodes TE through the contact hole CT passing through the black matrix BM may be formed. Accordingly, according to an embodiment of the present disclosure, a separate insulation layer may not be formed between the first touch electrodes TE and the bridge electrodes BE.

Moreover, according to an embodiment of the present disclosure, since the black matrix BM is disposed between the second touch electrodes RE and the bridge electrodes BE, each of the second touch electrodes RE may be insulated from each of the bridge electrodes BE even without a separate insulation layer being formed between the second touch electrodes RE and the bridge electrodes BE.

Moreover, according to an embodiment of the present disclosure, the black matrix BM or the first to third color filters 311 to 313 may be disposed between the first touch electrodes TE and the second touch electrodes RE. Accordingly, according to an embodiment of the present disclosure, each of the first touch electrodes TE may be insulated from each of the second touch electrodes RE even without a separate insulation layer being formed between the first touch electrodes TE and the second touch electrodes RE.

As a result, according to an embodiment of the present disclosure, a process of forming the touch sensing layer 40 is simplified, and moreover, an increase in thickness of the display device with integrated touch screen caused by the touch sensing layer 40 is minimized.

Moreover, according to an embodiment of the present disclosure, the first to third color filters 311 to 313 may be formed on the bridge electrode BE, and in this case, two adjacent color filters may be formed to overlap each other. Accordingly, according to an embodiment of the present disclosure, reflection of external light by the bridge electrode BE is reduced without adding a separate manufacturing process.

As a result, according to an embodiment of the present disclosure, a contrast ratio is enhanced without adding a separate manufacturing process. Moreover, according to an embodiment of the present disclosure, reflection of external light is reduced even without using a polarizer, and thus, a thickness of the touch sensing layer 40 is minimized.

Figure 9:
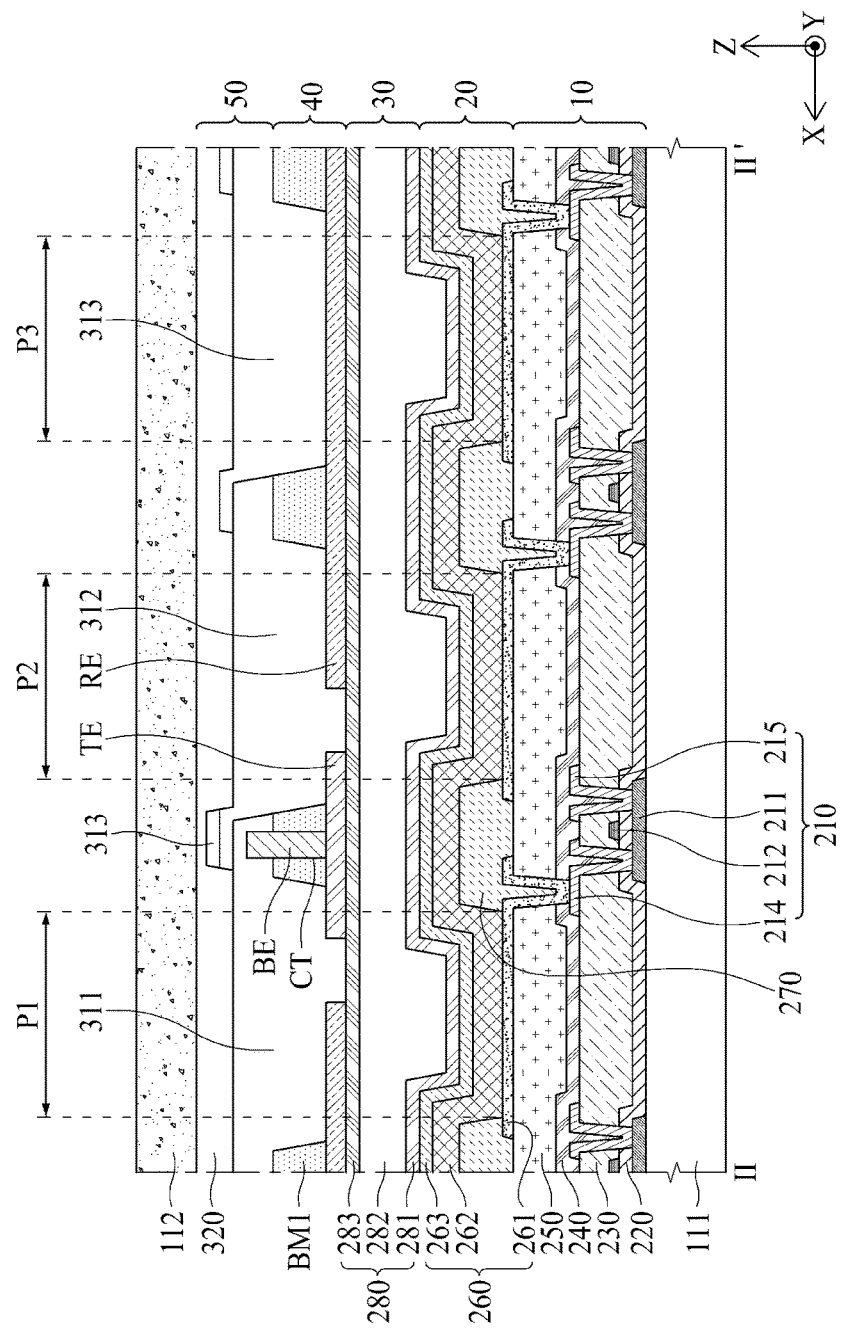
FIG. 9 is a cross-sectional view illustrating another example taken along line II-II' of FIG. 5 according to an embodiment of the present disclosure.
Figure 10:
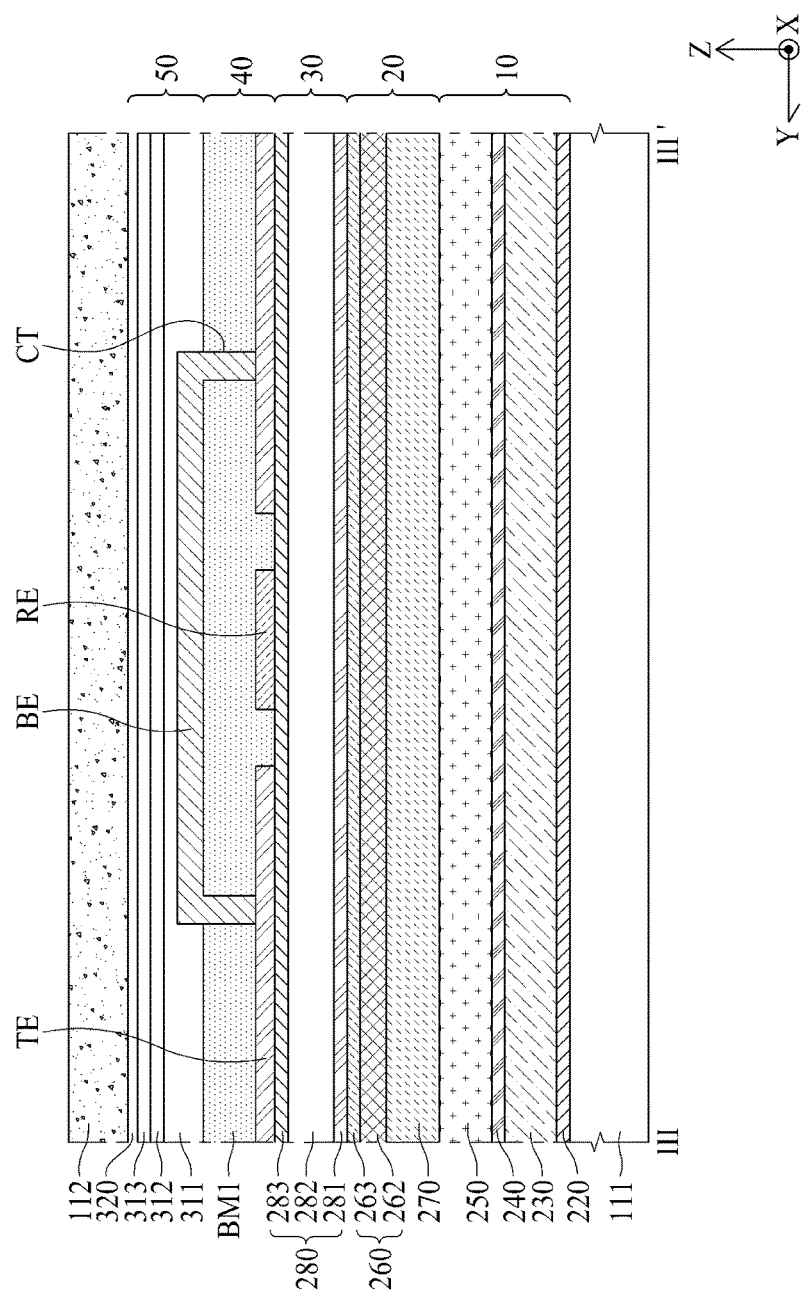
FIG. 10 is a cross-sectional view illustrating another example taken along line III-III' of FIG. 5 according to an embodiment of the present disclosure.

FIG. 9 is a cross-sectional view illustrating another example taken along line II-II' of FIG. 5 according to an embodiment of the present disclosure. FIG. 10 is a cross-sectional view illustrating another example taken along line III-III' of FIG. 5 according to an embodiment of the present disclosure.

Except that first to third color filters 311 to 313 are all formed on a bridge electrode BE, the cross-sectional views of FIGS. 9 and 10 are substantially the same as the details described above with reference to FIGS. 6 and 7. Therefore, detailed descriptions on the first substrate 111, the second substrate 112, the TFT layer 10, the organic light emitting device layer 20, and the encapsulation layer 30 illustrated in FIGS. 6 and 7 are omitted.

Referring to FIGS. 9 and 10, a touch sensing layer 40 may be formed on an encapsulation layer 30. The touch sensing layer 40 may include a plurality of first touch electrodes TE, a plurality of second touch electrodes RE, a plurality of bridge electrodes BE, and a black matrix BM.

The first touch electrodes TE and the second touch electrodes RE may be formed on the encapsulation layer 30. The first touch electrodes TE may be arranged in a first direction (a Y-axis direction) and connected to each other, and the second touch electrodes RE may be arranged in a second direction (an X-axis direction) and connected to each other. A first touch electrode TE, disposed in one side end among first touch electrodes TE connected to each other in the first direction (the Y-axis direction), may be connected to a first touch line TL. A second touch electrode RE, disposed in one side end among second touch electrodes RE connected to each other in the second direction (the X-axis direction), may be connected to a second touch line RL. The second touch line RL may be connected to the second touch driver 182 through a pad 330.

The black matrix BM may be formed on the first touch electrodes TE and the second touch electrode RE. The black matrix BM may include a plurality of first black matrixes BM1 arranged in the first direction (the Y-axis direction) and a plurality of second black matrixes BM2 arranged in the second direction (the X-axis direction). The black matrix BM may have a lattice type where the first black matrixes BM1 and the second black matrixes BM2 intersect each other, and may divide first to third color filters 311 to 313 to respectively correspond to the first to third pixels P1 to P3.

The black matrix BM may be provided in a non-emission part instead of an emission part and may be disposed to overlap a bank 270. The black matrix BM may be formed of an organic layer including a black pigment.

The bridge electrodes BE may be formed on the black matrix BM. The bridge electrode BE may electrically connect adjacent first touch electrodes TE through a plurality of contact holes CT which pass through the black matrix BM, particularly, the first black matrix BM1. The bridge electrode BE may be disposed on the first black matrix BM1 to overlap the first black matrix BM1.

The first touch electrodes TE, the second touch electrodes RE, the first touch lines TL, and the second touch lines RL may be disposed on the same layer. The black matrix BM may be disposed on the first touch electrodes TE and the second touch electrodes RE, and moreover, may be disposed between the first touch electrodes TE and the second touch electrodes RE. Each of the first touch electrodes TE may be insulated from each of the second touch electrodes RE by the black matrix BM.

A color filter layer 50 may be formed on the touch sensing layer 40. The color filter layer 50 may include first to third color filters 311 to 313. The first to third color filters 311 to 313 having a different transmissive wavelength range may be disposed in areas, divided by the black matrix BM, on the touch sensing layer 40. The first color filter 311 may be a red color filter disposed in correspondence with a first pixel P1, the second color filter 312 may be a green color filter disposed in correspondence with a second pixel P2, and the third color filter 313 may be a blue color filter disposed in correspondence with a third pixel P3.

The first color filter 311 may be formed of an organic layer including a red pigment, the second color filter 312 may be formed of an organic layer including a green pigment, and the third color filter 313 may be formed of an organic layer including a blue pigment.

Although not shown, the color filter layer 50 may further include a transparent organic layer disposed in correspondence with a white subpixel. In this case, the transparent organic layer may be formed of acryl resin, epoxy resin, phenolic resin, polyamide resin, polyimide resin, and/or the like.

At least one of the first to third color filters 311 to 313 may be formed on the black matrix BM. In an embodiment of the present disclosure, since the first to third color filters 311 to 313 are formed on the black matrix BM, two adjacent color filters may be formed to overlap each other on the black matrix BM. To provide description for example, in the color filter layer 50, the first color filter 311, the second color filter 312, and the third color filter 313 may be sequentially formed on the touch sensing layer 40. In this case, the first color filter 311 and the second color filter 312 may be sequentially formed to overlap each other on the black matrix BM disposed between the first color filter 311 and the second color filter 312. The second color filter 312 and the third color filter 313 may be sequentially formed to overlap each other on the black matrix BM disposed between the second color filter 312 and the third color filter 313. The third color filter 313 and the first color filter 311 may be sequentially formed to overlap each other on the black matrix BM disposed between the third color filter 313 and the first color filter 311.

The first to third color filters 311 to 313 may all be formed on the bridge electrodes BE as illustrated in FIGS. 9 and 10. In an embodiment of the present disclosure, nonadjacent color filters as well as two adjacent color filters may be formed to overlap each other on the bridge electrodes BE. To provide description for example, in the color filter layer 50, the first color filter 311, the second color filter 312, and the third color filter 313 may be sequentially formed on the touch sensing layer 40. In this case, the bridge electrodes BE may be provided so that the first color filter 311, the second color filter 312, and the third color filter 313 may be sequentially formed to overlap each other on the bridge electrodes BE.

In FIGS. 9 and 10, it is illustrated that the first to third color filters 311 to 313 are all disposed to overlap each other all over the first black matrix BM1 where the bridge electrodes BE are formed, but the present embodiment is not limited thereto. In other embodiments, the first to third color filters 311 to 313 may all be disposed to overlap each other in only an area where the bridge electrodes BE are formed.

In an embodiment illustrated in FIGS. 9 and 10, since the first to third color filters 311 to 313 are all disposed to overlap each other on the bridge electrode BE, reflection of light by the bridge electrode BE is minimized.

Since the color filter layer 50 illustrated in FIGS. 9 and 10 is disposed so that the first to third color filters 311 to 313 are all disposed to overlap each other on the bridge electrode BE, a step height occurs, and for this reason, an overcoat layer 320 for planarizing the step height may be further formed on the first to third color filters 311 to 313.

Figure 11:
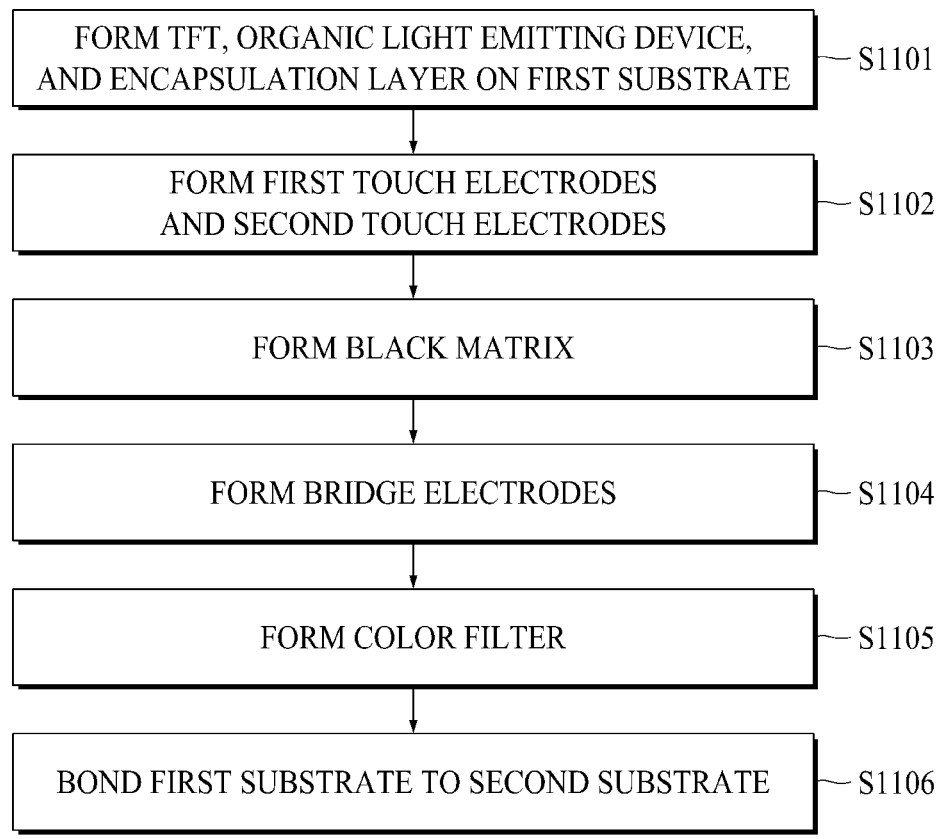
FIG. 11 is a flowchart illustrating a method of manufacturing a display device with integrated touch screen according to an embodiment of the present disclosure.

FIG. 11 is a flowchart illustrating a method of manufacturing a display device with integrated touch screen according to an embodiment of the present disclosure. FIGS. 12A to 12F are cross-sectional views taken along line II-II' of FIG. 5 for describing a method of manufacturing a display device with integrated touch screen according to an embodiment of the present disclosure. FIGS. 13A to 13F are cross-sectional views taken along line III-III' of FIG. 5 for describing a method of manufacturing a display device with integrated touch screen according to an embodiment of the present disclosure.

First, a TFT layer 10, an organic light emitting device layer 20, and an encapsulation layer 30 may be formed on a first substrate 111 in operation S1101.

Figure 12A:
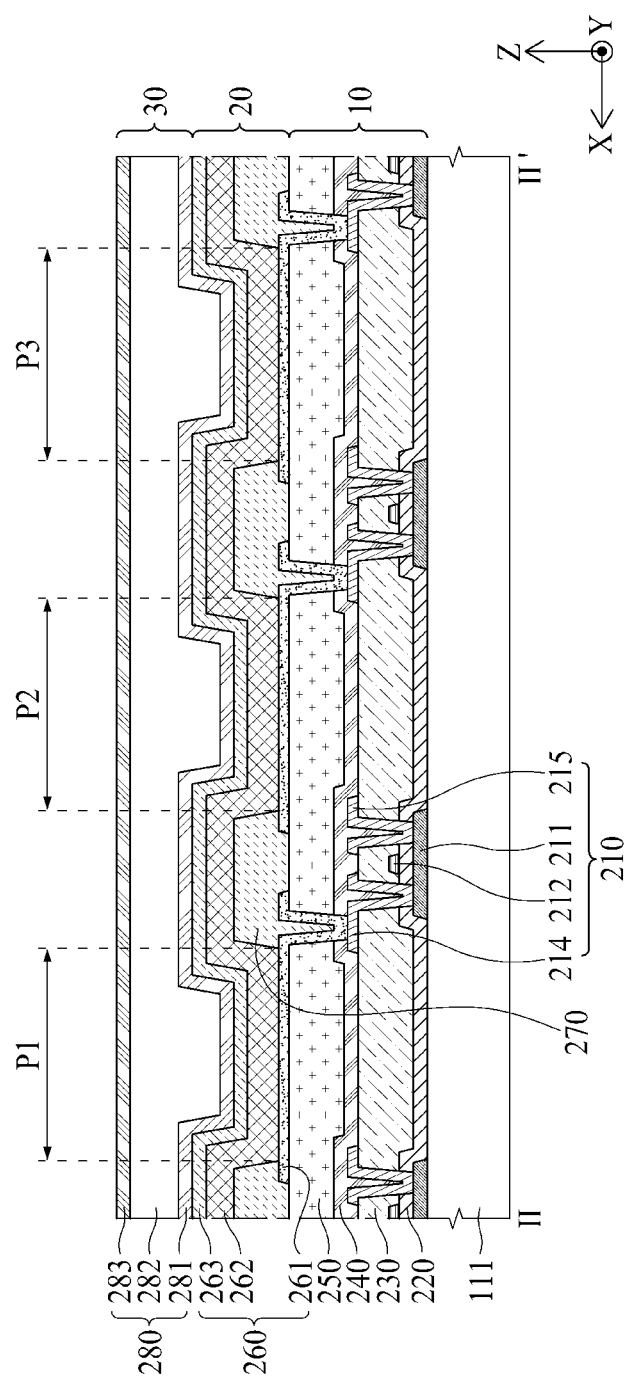
Figure 13A:
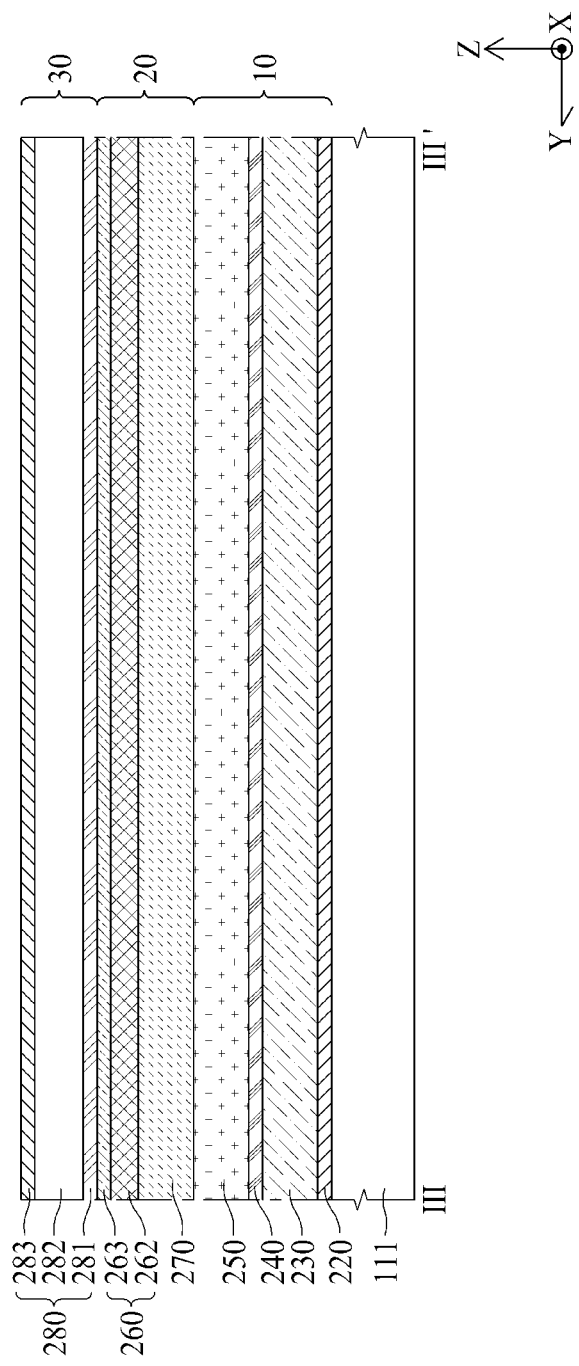

As illustrated in FIGS. 12A and 13A, a plurality of TFTs 210, a plurality of organic light emitting devices 260, and an encapsulation film 280 may be formed on the first substrate 111. In detail, a buffer layer may be formed on the first substrate 111. The buffer layer is for protecting the TFTs 210 and the organic light emitting devices 260 from water penetrating through the first substrate 111 vulnerable to penetration of water and may be formed of a plurality of inorganic layers which are alternately stacked. For example, the buffer layer may be formed of a multilayer where one or more inorganic layers of SiOx, SiNx, and SiON are alternately stacked. The buffer layer may be formed by a chemical vapor deposition (CVD) process.

Subsequently, an active layer 211 included in each of the TFTs 210 may be formed on the buffer layer. In detail, an active metal layer may be formed all over the buffer layer by using a sputtering process, a metal organic chemical vapor deposition (MOCVD) process, and/or the like. Subsequently, the active layer 211 may be formed by patterning the active metal layer through a mask process using a photoresist pattern. The active layer 211 may be formed of a silicon-based semiconductor material or an oxide-based semiconductor material.

Subsequently, a gate insulation layer 220 may be formed on the active layer 211. The gate insulation layer 220 may be formed of an inorganic layer, and for example, may be formed of SiOx, SiNx, or a multilayer thereof.

Subsequently, a gate electrode 212 included in each of the TFTs 210 may be formed on the gate insulation layer 220. In detail, a first metal layer may be formed all over the gate insulation layer 220 by using a sputtering process, an MOCVD process, and/or the like. Subsequently, the gate electrode 212 may be formed by patterning the first metal layer through a mask process using a photoresist pattern. The gate electrode 212 may be formed of a single layer or a multilayer which includes one of Mo, Al, Cr, Au, Ti, Ni, Nd, and Cu, or an alloy thereof.

Subsequently, an interlayer insulation layer 230 may be formed on the gate electrode 212. The interlayer insulation layer 230 may be formed of an inorganic layer, and for example, may be formed of SiOx, SiNx, or a multilayer thereof.

Subsequently, a plurality of contact holes which pass through the gate insulation layer 220 and the interlayer insulation layer 230 and expose the active layer 211 may be formed.

Subsequently, a source electrode 214 and a drain electrode 215 included in each of the TFTs 210 may be formed on the interlayer insulation layer 230. In detail, a second metal layer may be formed all over the interlayer insulation layer 230 by using a sputtering process, an MOCVD process, and/or the like. Subsequently, the source electrode 214 and the drain electrode 215 may be formed by patterning the second metal layer through a mask process using a photoresist pattern. The source electrode 214 and the drain electrode 215 may contact the active layer 211 through the contact holes which pass through the gate insulation layer 220 and the interlayer insulation layer 230. The source electrode 214 and the drain electrode 215 may each be formed of a single layer or a multilayer which includes one of Mo, Al, Cr,Au, Ti, Ni, Nd, and Cu, or an alloy thereof.

Subsequently, a passivation layer 240 may be formed on the source electrode 214 and the drain electrode 215 of each of the TFTs 210. The passivation layer 240 may be formed of an inorganic layer, and for example, may be formed of SiOx, SiNx, or a multilayer thereof. The passivation layer 240 may be formed by a CVD process.

Subsequently, a planarization layer 250 for planarizing a step height caused by the TFTs 210 may be formed on the passivation layer 240. The passivation layer 250 may be formed of an organic layer such as acryl resin, epoxy resin, phenolic resin, polyamide resin, polyimide resin, and/or the like.

Subsequently, a first electrode 261 included in the organic light emitting device 260 may be formed on the planarization layer 250. In detail, a third metal layer may be formed all over the planarization layer 250 by using a sputtering process, an MOCVD process, and/or the like. Subsequently, the first electrode 261 may be formed by patterning the third metal layer through a mask process using a photoresist pattern. The first electrode 261 may contact the source electrode 214 of each of the TFTs 210 through a contact hole which passes through the passivation layer 240 and the planarization layer 250. The first electrode 261 may be formed of a metal material, which is high in reflectivity, such as a stacked structure (Ti/Al/Ti) of Al and Ti, a stacked structure (ITO/Al/ITO) of Al and ITO, an APC alloy, or a stacked structure (ITO/APC/ITO) of an APC alloy and ITO.

Subsequently, a bank 270 may be formed on the planarization layer 250 to cover an edge of the first electrode 261, for dividing a plurality of pixels P1 to P3. The bank 270 may be formed of an organic layer such as acryl resin, epoxy resin, phenolic resin, polyamide resin, polyimide resin, and/or the like.

Subsequently, an organic light emitting layer 262 may be formed on the first electrode 261 and the bank 270 through a deposition process or a solution process. The organic light emitting layer 262 may be a common layer which is formed in the pixels P1 to P3 in common. In this case, the organic light emitting layer 262 may be a white light emitting layer which emits white light.

Subsequently, a second electrode 263 may be formed on the organic light emitting layer 262. The second electrode 263 may be a common layer which is formed in the pixels P1 to P3 in common. The second electrode 263 may be formed of a transparent conductive material (or TCO) such as ITO or IZO capable of transmitting light. The second electrode 263 may be formed through a physical vapor deposition (PVD) process such as a sputtering process and/or the like. A capping layer may be formed on the second electrode 263.

Subsequently, an encapsulation film 280 may be formed on the second electrode 263. The encapsulation film 280 prevents oxygen or water from penetrating into the organic light emitting layer 262 and the second electrode 263. To this end, the encapsulation film 280 may include at least one inorganic film and at least one organic film.

For example, the encapsulation film 280 may include a first inorganic film 281, an organic film 282, and a second inorganic film 283. In this case, the first inorganic film 281 may be formed to cover the second electrode 263. The organic film 282 may be formed to cover the first inorganic film 281. The organic film 282 may be formed to a sufficient thickness, for preventing particles from penetrating into the organic light emitting layer 262 and the second electrode 263 via the first inorganic film 281. The second inorganic film 283 may be formed to cover the organic film 282.

Each of the first and second inorganic films 281 and 283 may be formed of silicon nitride, aluminum nitride, zirconium nitride, titanium nitride, hafnium nitride, tantalum nitride, silicon oxide, aluminum oxide, titanium oxide, and/or the like. The organic film 282 may be formed of acryl resin, epoxy resin, phenolic resin, polyamide resin, polyimide resin, and/or the like.

Subsequently, a plurality of first touch electrodes TE and a plurality of second touch electrodes RE may be formed in operation S1102.

Figure 12B:
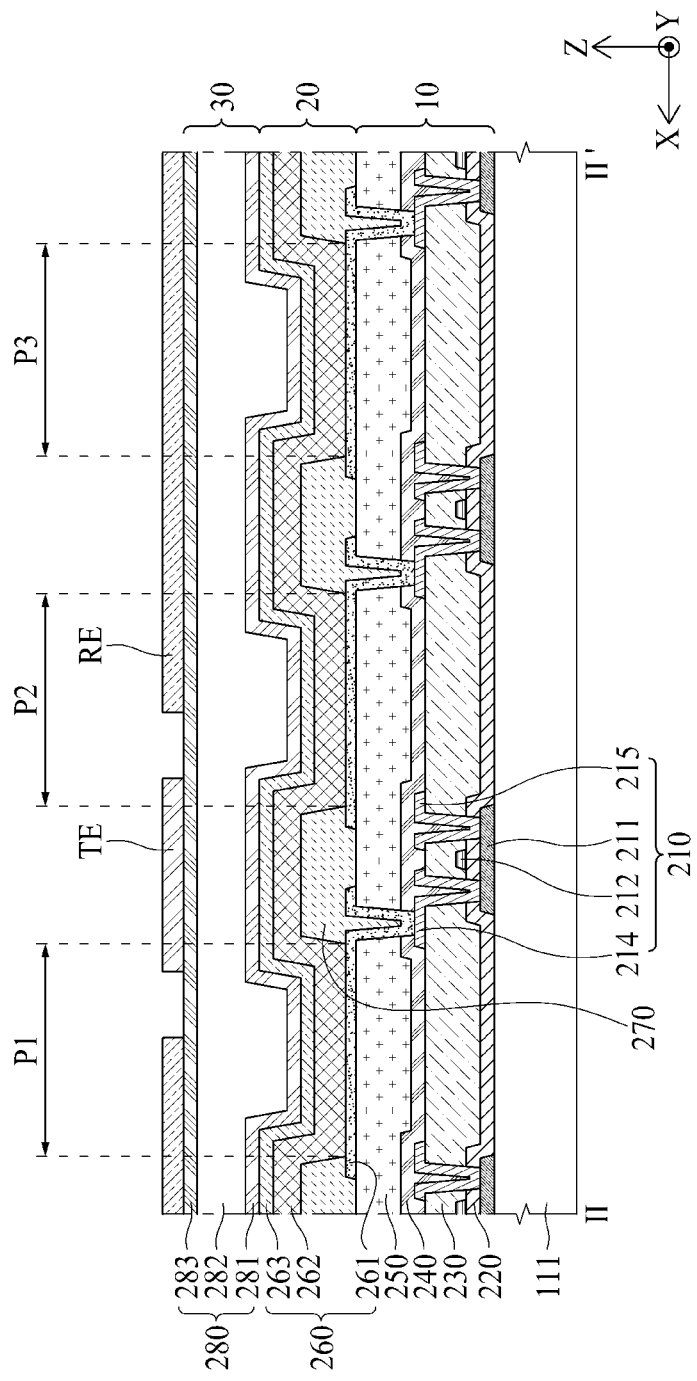
Figure 13B:
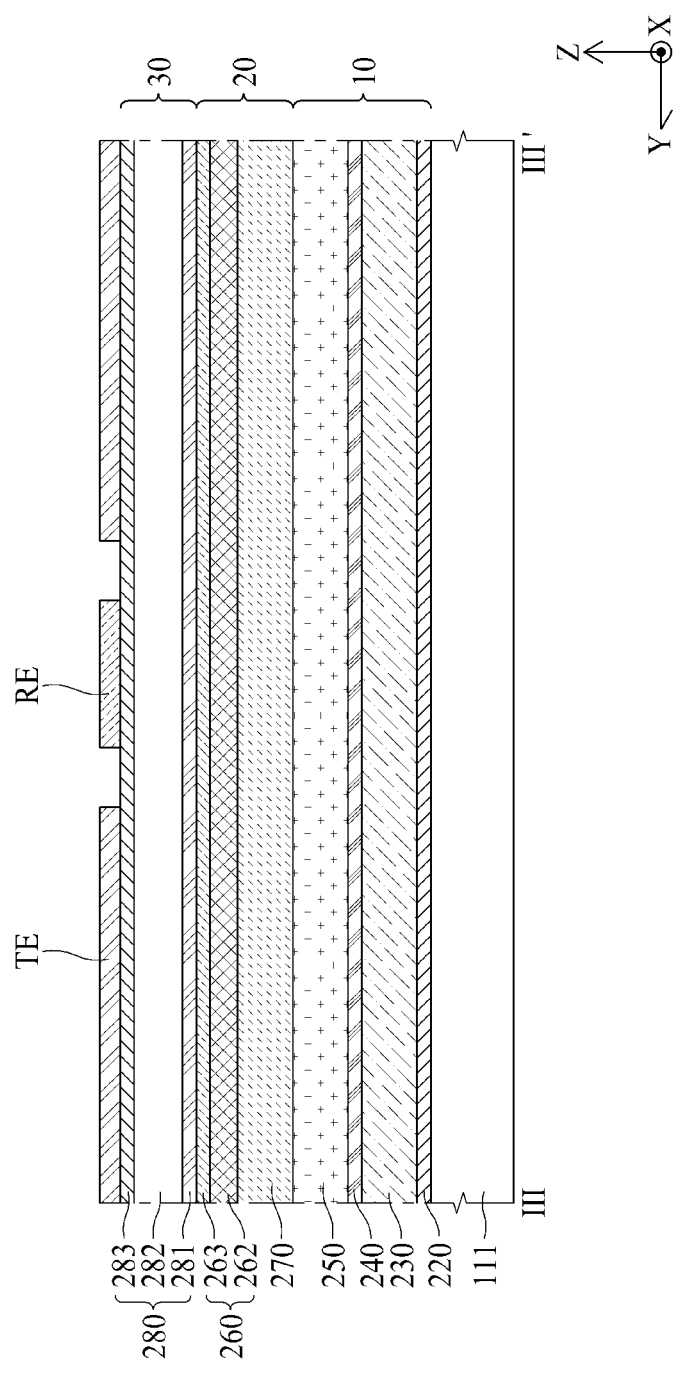

As illustrated in FIGS. 12B and 13B, the first touch electrodes TE and the second touch electrodes RE may be formed on the encapsulation film 280. In detail, the first touch electrodes TE may be arranged in a first direction (a Y-axis direction) and may be spaced apart from each other by a certain interval, and the second touch electrodes RE may be arranged in a second direction (an X-axis direction) and may be connected to each other. In this case, the first touch electrodes TE and the second touch electrodes RE may each have a rectangular shape, an octagonal shape, a circular shape, a lozenged shape, or the like.

The first touch electrodes TE and the second touch electrodes RE may be formed of a transparent conductive material (or TCO) such as ITO or IZO capable of transmitting light. The first touch electrodes TE and the second touch electrodes RE may be formed through a PVD process such as a sputtering process and/or the like.

Subsequently, a black matrix BM may be formed in operation S1103.

Figure 12C:
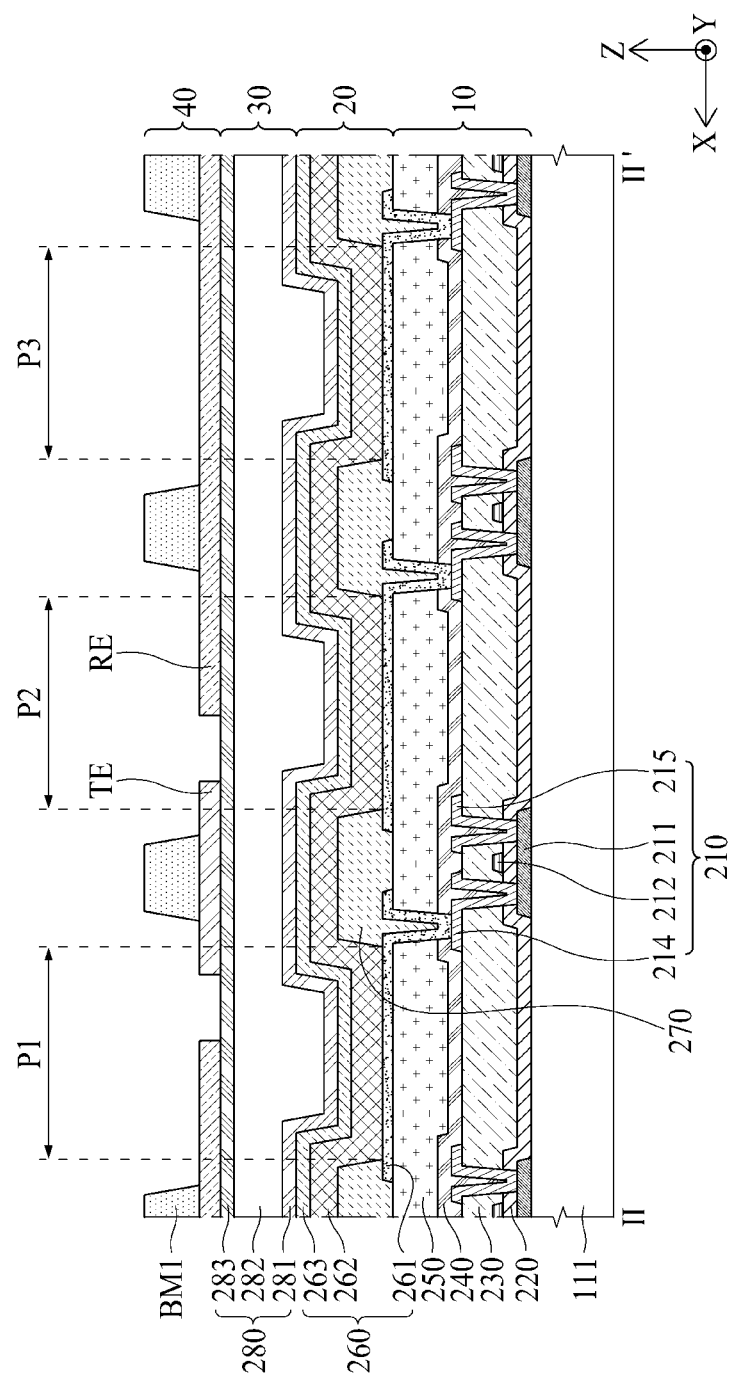
Figure 13C:
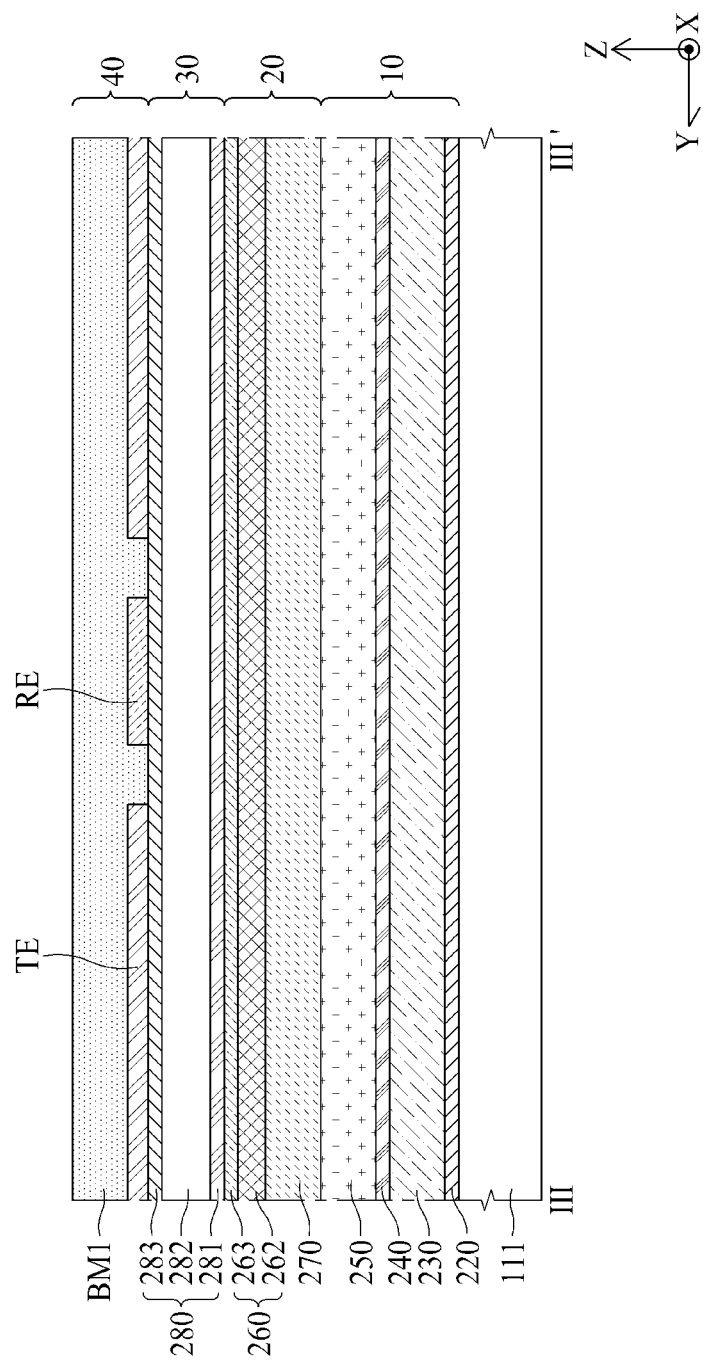

As illustrated in FIGS. 12C and 13C, the black matrix BM may be formed on the first touch electrodes TE and the second touch electrode RE. In detail, a plurality of first black matrixes BM1 arranged in the first direction (the Y-axis direction) and a plurality of second black matrixes BM2 arranged in the second direction (the X-axis direction) may be formed on the first touch electrodes TE and the second touch electrode RE. The black matrix BM may have a lattice type where the first black matrixes BM1 and the second black matrixes BM2 intersect each other, and may divide first to third color filters 311 to 313 to respectively correspond to the first to third pixels P1 to P3. The black matrix BM may be an organic material including a black pigment.

Subsequently, a plurality of bridge electrodes BE may be formed in operation S1104.

Figure 12D:
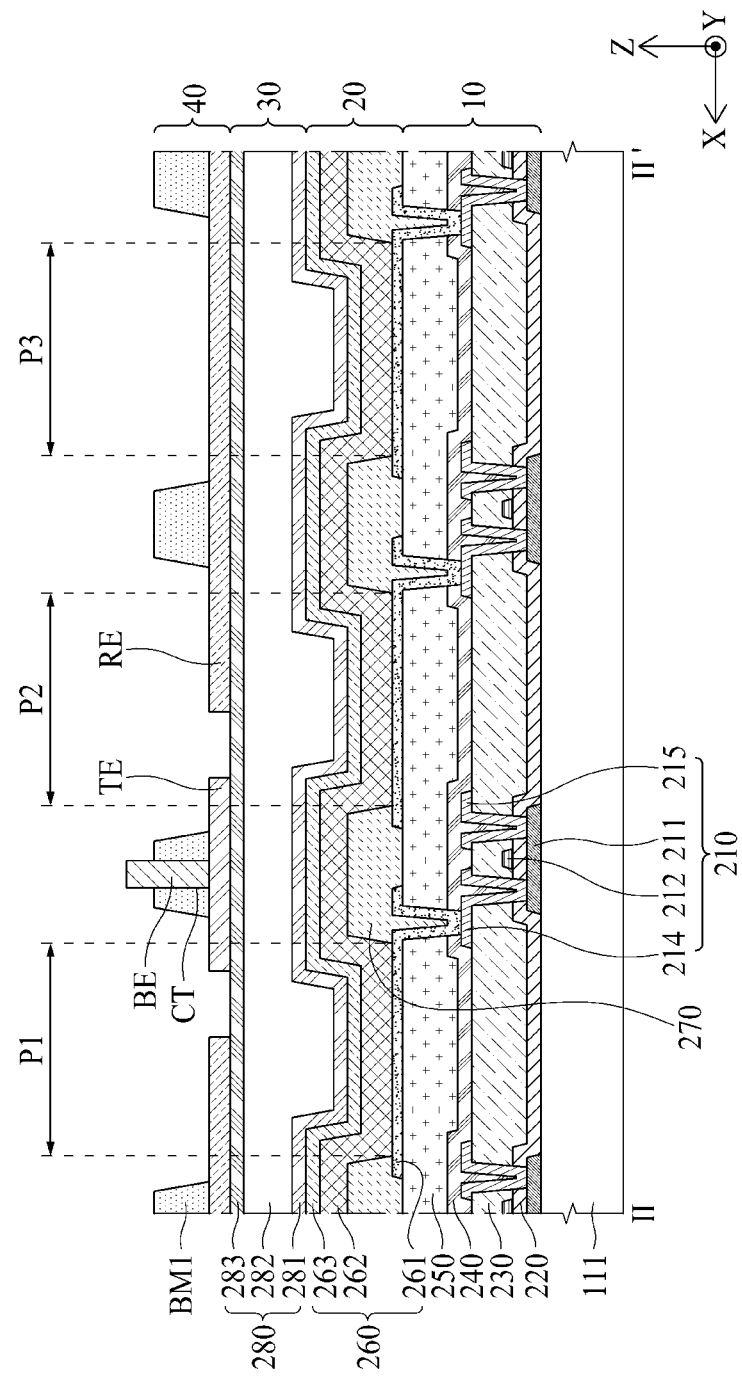
Figure 13D:
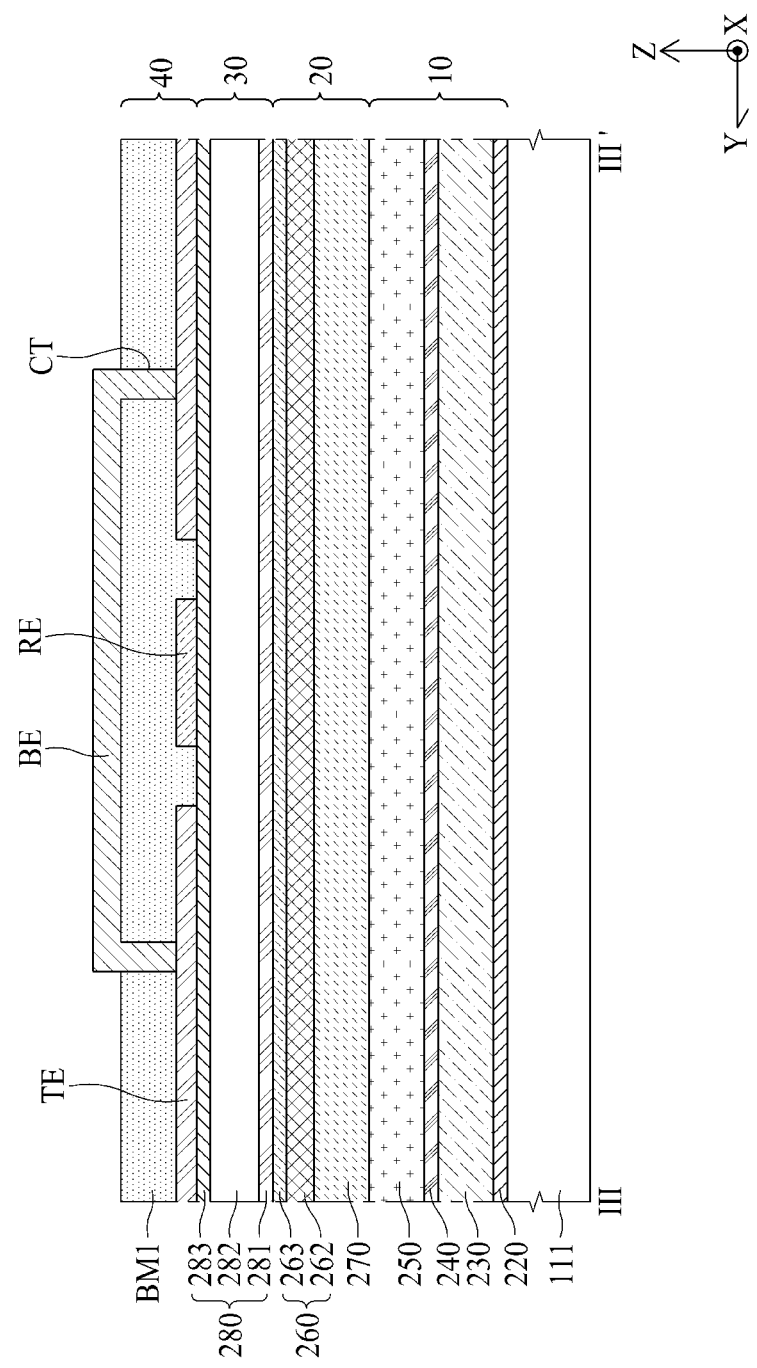

As illustrated in FIGS. 12D and 13D, the bridge electrodes BE may be formed on the first black matrix BM1. In detail, a plurality of contact holes CT which expose some portion of first touch electrodes TE adjacent to the first black matrix BM1 may be formed.

Subsequently, the bridge electrode BE may be formed on the first black matrix BM1 through a mask process using a photoresist pattern. The bridge electrode BE may be electrically connected to first touch electrodes TE adjacent to the bridge electrode BE through a contact hole CT passing through the first black matrix BM1. Since the bridge electrode BE is formed to overlap the black matrix BM, the bridge electrode BE may be formed of a conductive material, and a transparent metal material such as the materials used for the first touch electrodes TE and the second touch electrodes RE is not needed. The bridge electrode BE may be formed of one metal selected from the group consisting of Mo, Ag, Ti, Al, and Cu, one or more alloys, a transparent conductive material such as ITO or IZO, or a conductive polymer, but is not limited thereto.

Subsequently, a color filter layer 50 may be formed in operation S1105.

Figure 12E:
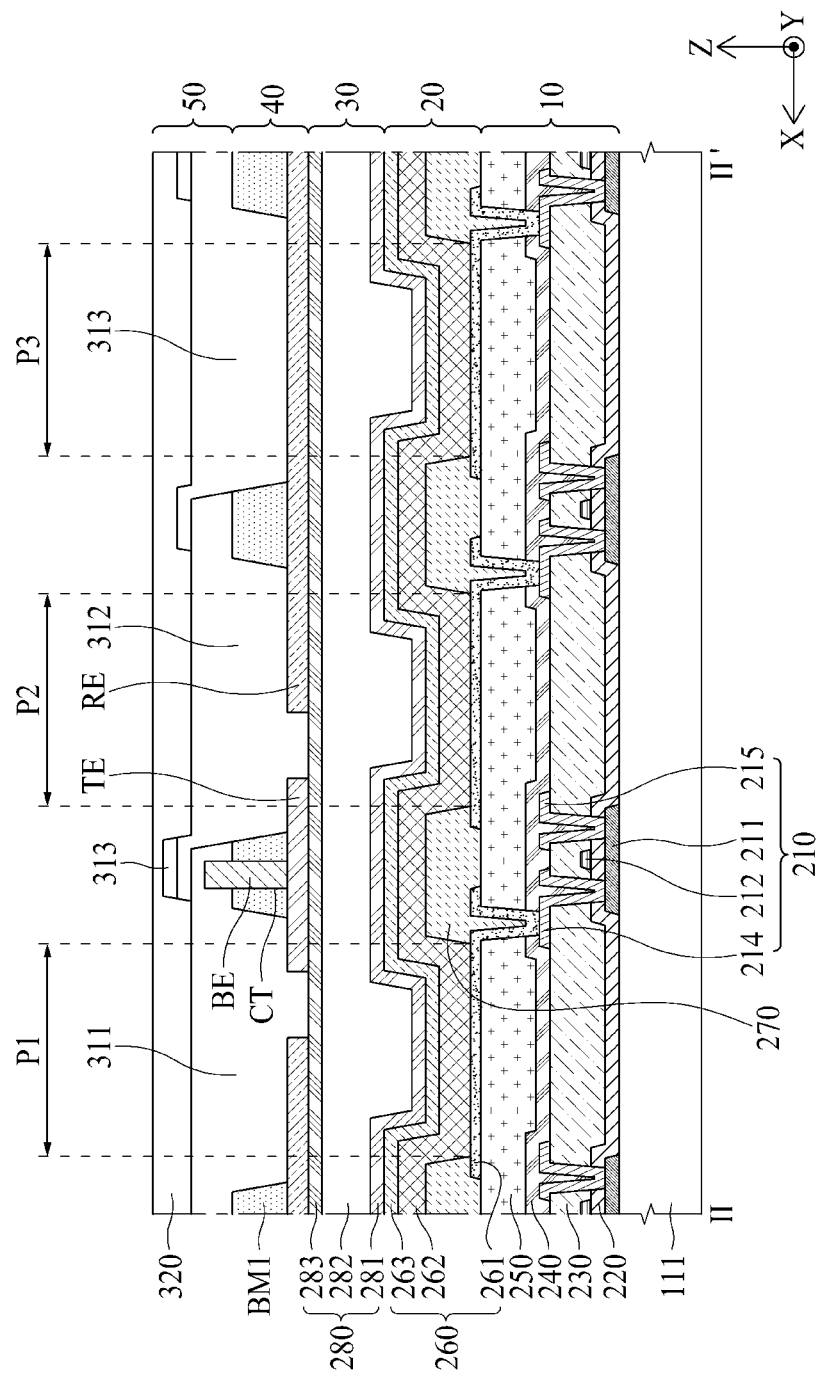

As illustrated in FIGS. 12E and 13E, the color filter layer 50 may be formed on a touch sensing layer 40. In detail, the first to third color filters 311 to 313 may be formed on the touch sensing layer 40 which includes the first touch electrodes TE, the second touch electrodes RE, the black matrix BM, and the bridge electrodes BE. For example, an organic material including a red pigment may be coated in a lattice area corresponding to a red subpixel P1 among a plurality of lattice areas divided by the black matrix BM, and by performing a photo process, the first color filter 311 may be formed. Subsequently, an organic material including a green pigment may be coated in a lattice area corresponding to a green subpixel P2, and by performing a photo process, the second color filter 312 may be formed. Subsequently, an organic material including a blue pigment may be coated in a lattice area corresponding to a blue subpixel P3, and by performing a photo process, the third color filter 313 may be formed.

In this case, two adjacent color filters may be formed to overlap each other on the black matrix BM. Also, the first to third color filters 311 to 313 may all be formed to overlap each other on the first black matrix BM1, where the bridge electrode BE is formed, of the black matrix BM.

Hereinabove, an example where a red color filter, a green color filter, and a blue color filter are formed in order has been exemplarily described, but an order in which color filters are formed is not limited thereto.

Subsequently, an overcoat layer 320 for planarizing a step height may be formed on the first to third color filters 311 to 313.

Subsequently, the first substrate 111 and the second substrate 112 may be bonded to each other in operation S1106.

Figure 13F:
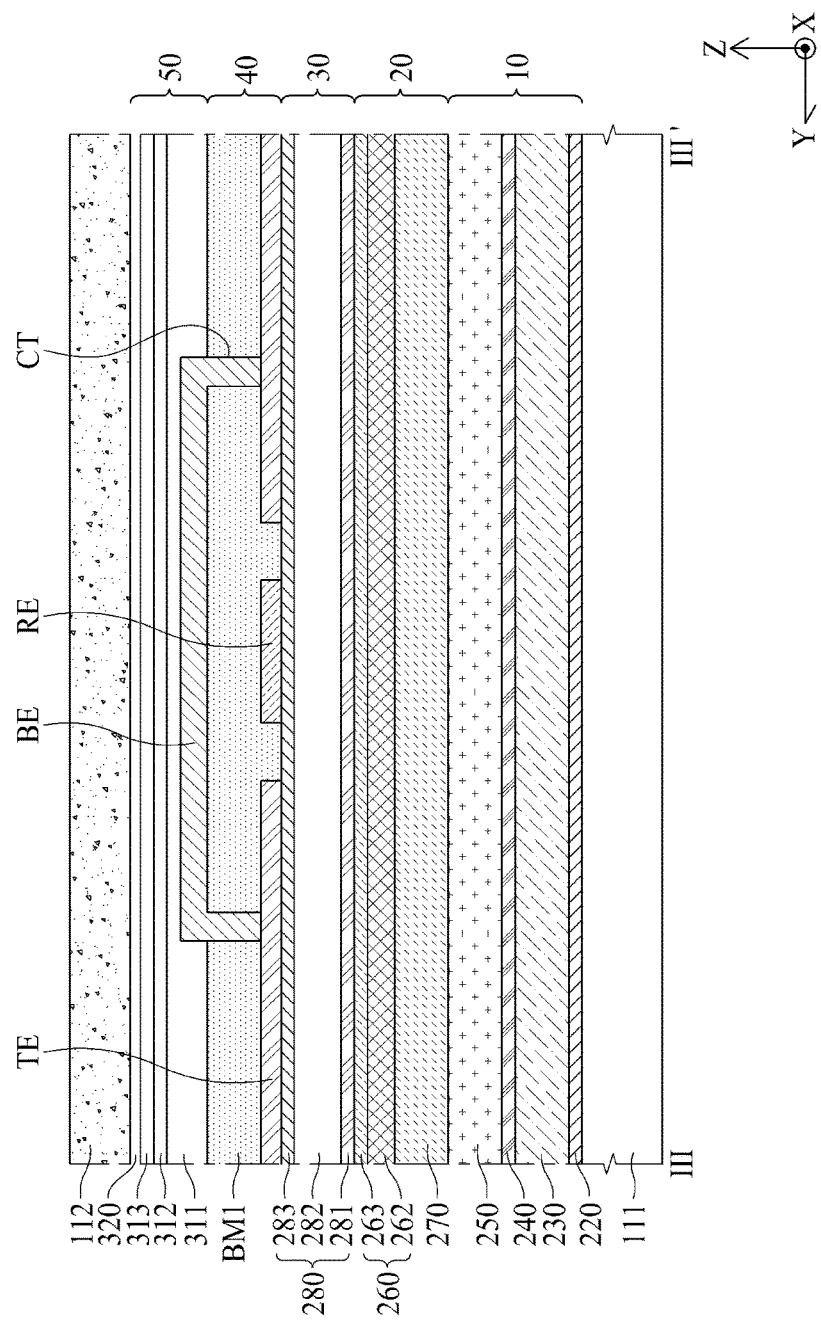

As illustrated in FIGS. 12F and 13F, the second substrate 112 may be bonded to the color filter layer 50. In detail, the color filter layer 50 of the first substrate 111 may be adhered to the second substrate 112 by using an adhesive layer (not shown), thereby bonding the first substrate 111 to the second substrate 112. The adhesive layer (not shown) may be an optically clear resin (OCR) or an optically clear adhesive film (OCA).

According to the embodiments of the present disclosure, there is provided a method of manufacturing a display device with integrated touch screen, the method comprising forming a plurality of first touch electrodes and a plurality of second touch electrodes on a substrate, forming a black matrix on the plurality of first touch electrodes and the plurality of second touch electrodes, and forming a bridge electrode on the black matrix, the bridge electrode electrically connecting adjacent first touch electrodes.

According to the embodiments of the present disclosure, the forming of the bridge electrode may comprise forming a plurality of through holes passing through the black matrix, and forming the bridge electrode to be connected to the plurality of first touch electrodes through the plurality of through holes.

According to the embodiments of the present disclosure, the forming of the bridge electrode may comprise forming the bridge electrode on the black matrix to overlap the black matrix.

According to the embodiments of the present disclosure, the method may further comprise forming a first color filter, a second color filter, and a third color filter in in a plurality of areas divided by the black matrix, wherein the first color filter, the second color filter, and the third color filter are formed to overlap each other on the bridge electrode.

According to the embodiments of the present disclosure, there is provided a method of manufacturing a display device with integrated touch screen, the method comprising forming a plurality of first touch electrodes and a plurality of second touch electrodes on a substrate, forming a black matrix on the plurality of first touch electrodes and the plurality of second touch electrodes, forming a plurality of bridge electrodes on the black matrix, the plurality of bridge electrodes overlapping each other and electrically connecting the plurality of first touch electrodes, and forming a red color filter, a green color filter, and a blue color filter in a plurality of areas divided by the black matrix, wherein the red color filter, the green color filter, and the blue color filter are provided to overlap each other on the plurality of the bridge electrodes.

According to the embodiments of the present disclosure, since the touch sensing layer may be directly formed on the encapsulation layer and the color filter layer may be directly formed on the touch sensing layer, alignment is not needed in bonding the first substrate to the second substrate, and a separate adhesive layer is not needed.

Moreover, according to the embodiments of the present disclosure, since the black matrix may be directly formed on the first touch electrodes and the bridge electrodes for electrically connecting adjacent first touch electrodes through the contact hole passing through the black matrix are formed, a separate insulation layer may not be formed between the first touch electrodes and the bridge electrodes.

Moreover, according to the embodiments of the present disclosure, since the black matrix is disposed between the second touch electrodes and the bridge electrodes, a separate insulation layer for insulating the second touch electrodes and the bridge electrodes may not be formed.

Moreover, according to the embodiments of the present disclosure, since the black matrix or the first to third color filters is/are disposed between the first touch electrodes and the second touch electrodes, a separate insulation layer for insulating the first touch electrodes and the second touch electrodes may not be formed.

As a result, according to the embodiments of the present disclosure, a process of forming the touch sensing layer is simplified, and moreover, an increase in thickness of the display device with integrated touch screen caused by the touch sensing layer is minimized.

Moreover, according to the embodiments of the present disclosure, since two or more of the first to third color filters are formed to overlap each other on the bridge electrode, reflection of external light by the bridge electrode is reduced. Accordingly, according to the embodiments of the present disclosure, a contrast ratio is enhanced without adding a separate manufacturing process.

Moreover, according to the embodiments of the present disclosure, reflection of external light is reduced even without using a polarizer, and thus, a thickness of the touch sensing layer is minimized.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A method for manufacturing a display device with an integrated touch screen, comprising:
   forming an organic light emitting device layer on a substrate;
   forming an encapsulation layer covering and surrounding the organic light emitting device layer;
   forming a plurality of first touch electrodes and a plurality of second touch electrodes on the encapsulation layer;
   forming a black matrix on the plurality of first touch electrodes and the plurality of second touch electrodes; and
   forming a plurality of bridge electrodes on the black matrix, the plurality of bridge electrodes electrically connecting the plurality of first touch electrodes,
   wherein the plurality of bridge electrodes are connected to the plurality of first touch electrodes through a plurality of contact holes passing through the black matrix.

2. The method of claim 1, wherein the black matrix is provided on the plurality of first touch electrodes and the plurality of second touch electrodes.

3. The method of claim 1, wherein the black matrix is provided between the plurality of first touch electrodes and the plurality of second touch electrodes.

4. The method of claim 1, wherein the organic light emitting device layer includes a bank disposed to overlap the black matrix.

5. The method of claim 1, wherein the black matrix comprises an organic layer including a black pigment.

6. The method of claim 1, further comprising:
   forming a plurality of color filters in a plurality of areas divided by the black matrix, after forming the black matrix and before forming the bridge electrodes,
   wherein the plurality of color filters comprises a first color filter including a first color material, a second color filter including a second color material, and a third color filter including a third color material.

7. The method of claim 6, wherein two of the first color filter, the second color filter, and the third color filter are provided to overlap each other on the plurality of bridge electrodes.

8. The method of claim 6, wherein the first color filter, the second filter, and the third color filter are provided to overlap each other on the plurality of bridge electrodes.

9. The method of claim 8, further comprising:
forming an overcoat layer on the first color filter, the second color filter, and the third color filter, after forming the color filters and before forming the bridge electrodes.

10. The method of claim 6, wherein the first color filter, the second color filter, and the third color filter are disposed between the plurality of first touch electrodes and the plurality of second touch electrodes.

11. The method of claim 1, wherein the black matrix includes a plurality of first black matrixes arranged in a first direction and a plurality of second black matrixes arranged in a second direction different from the first direction, wherein the first black matrixes and the second black matrixes intersect each other to form a lattice type.

12. The method of claim 11, wherein the plurality of bridge electrodes are disposed on the plurality of first black matrixes to overlap the plurality of first black matrixes.

13. The method of claim 12, wherein the first touch electrodes are arranged in the first direction and connected to each other, and the second touch electrodes are arranged in the second direction and connected to each other.

14. The method of claim 1, wherein the plurality of bridge electrodes are disposed on a layer different from a layer on which the first touch electrodes and the second touch electrodes are disposed, and intersect with the plurality of second touch electrodes.

15. The method of claim 1, further comprising:
forming a first touch line electrically connected with the first touch electrodes and a second touch line electrically connected with the second touch electrodes on the encapsulation layer,
wherein the first touch line and the second touch line are disposed on a same layer.

16. The method of claim 1, further comprising:
forming a thin film transistor (TFT) layer on the substrate, before forming the organic light emitting layer; and
depositing a passivation layer covering the TFT layer on the substrate, wherein the organic light emitting device layer is disposed on the passivation layer,
wherein the encapsulation layer contacts at least a part of the passivation layer.

17. The method of claim 1, further comprising:
disposing a second substrate on the first substrate, wherein the second substrate covers the black matrix.

* * * * *